(12) United States Patent
Sano et al.

(10) Patent No.: US 11,769,554 B2
(45) Date of Patent: Sep. 26, 2023

(54) SEMICONDUCTOR MEMORY DEVICE

(71) Applicant: Kioxia Corporation, Tokyo (JP)

(72) Inventors: Kyosuke Sano, Kamakura (JP); Kazutaka Ikegami, Inagi (JP); Takashi Maeda, Kamakura (JP); Rieko Funatsuki, Yokohama (JP)

(73) Assignee: Kioxia Corporation, Tokyo (JP)

( * ) Notice: Subject to any disclaimer, the term of this patent is extended or adjusted under 35 U.S.C. 154(b) by 200 days.

(21) Appl. No.: 17/447,464

(22) Filed: Sep. 13, 2021

(65) Prior Publication Data

US 2022/0301636 A1 Sep. 22, 2022

(30) Foreign Application Priority Data

Mar. 18, 2021 (JP) ................................ 2021-045261

(51) Int. Cl.
| | | |
|---|---|---|
| *G11C 11/34* | (2006.01) | |
| *G11C 16/26* | (2006.01) | |
| *G11C 16/30* | (2006.01) | |
| *G11C 16/04* | (2006.01) | |
| *H10B 41/10* | (2023.01) | |
| *H10B 41/27* | (2023.01) | |
| *H10B 43/10* | (2023.01) | |
| *H10B 43/27* | (2023.01) | |

(52) U.S. Cl.
CPC .......... *G11C 16/26* (2013.01); *G11C 16/0483* (2013.01); *G11C 16/30* (2013.01); *H10B 41/10* (2023.02); *H10B 41/27* (2023.02); *H10B 43/10* (2023.02); *H10B 43/27* (2023.02)

(58) Field of Classification Search
CPC . G11C 16/10; G11C 16/0416; G11C 16/0483; H01L 27/115; H01L 27/11521
USPC ........................... 365/185.05, 185.18, 63, 51
See application file for complete search history.

(56) References Cited

U.S. PATENT DOCUMENTS

| | | | |
|---|---|---|---|
| 8,320,182 B2 * | 11/2012 | Kirisawa ................ | H10B 43/27 365/185.17 |
| 9,792,996 B1 | 10/2017 | Date | |
| 10,658,295 B2 * | 5/2020 | Kawai .................... | G11C 16/14 |
| 2017/0271021 A1 | 9/2017 | Futatsuyama et al. | |

(Continued)

FOREIGN PATENT DOCUMENTS

| | | |
|---|---|---|
| JP | 2017-168163 A | 9/2017 |
| JP | 2017-216025 A | 12/2017 |

(Continued)

*Primary Examiner* — Son T Dinh
(74) *Attorney, Agent, or Firm* — Oblon, McClelland, Maier & Neustadt, L.L.P.

(57) ABSTRACT

A semiconductor memory device of embodiments includes: a substrate; a memory pillar; first to sixth conductive layers provided above the substrate; first to sixth memory cells formed between the first to sixth conductive layers and the memory pillar, respectively; and a control circuit. The control circuit applies a first voltage to the first, second, a sixth conductive layer and applies a second voltage to the third, fifth conductive layer, then applies a third voltage to the first conductive layer, applies a fourth voltage to the sixth conductive layer, and applies a fifth voltage to the second conductive layer, and then applies a sixth voltage to the first conductive layer, applies a seventh voltage to the sixth conductive layer, and applies an eighth voltage lower than the fifth voltage to the second conductive layer.

17 Claims, 29 Drawing Sheets

(56) References Cited

U.S. PATENT DOCUMENTS

| | | |
|---|---|---|
| 2019/0115070 A1 | 4/2019 | Harada |
| 2020/0090741 A1 | 3/2020 | Suzuki |
| 2020/0090752 A1 | 3/2020 | Kato et al. |
| 2022/0208247 A1 | 6/2022 | Inuzuka |

FOREIGN PATENT DOCUMENTS

| | | |
|---|---|---|
| JP | 2019-075180 A | 5/2019 |
| JP | 2020-047329 A | 3/2020 |
| JP | 2020-047348 A | 3/2020 |
| JP | 2022-102917 A | 7/2022 |

* cited by examiner

TIME

SEMICONDUCTOR MEMORY DEVICE

CROSS-REFERENCE TO RELATED APPLICATION

This application is based upon and claims the benefit of priority from Japanese Patent Application No. 2021-045261, filed on Mar. 18, 2021, the entire contents of which are incorporated herein by reference.

FIELD

Embodiments described herein relate generally to a semiconductor memory device

BACKGROUND

A NAND flash memory is known as a non-volatile semiconductor memory device.

DETAILED DESCRIPTION

Figure 1:
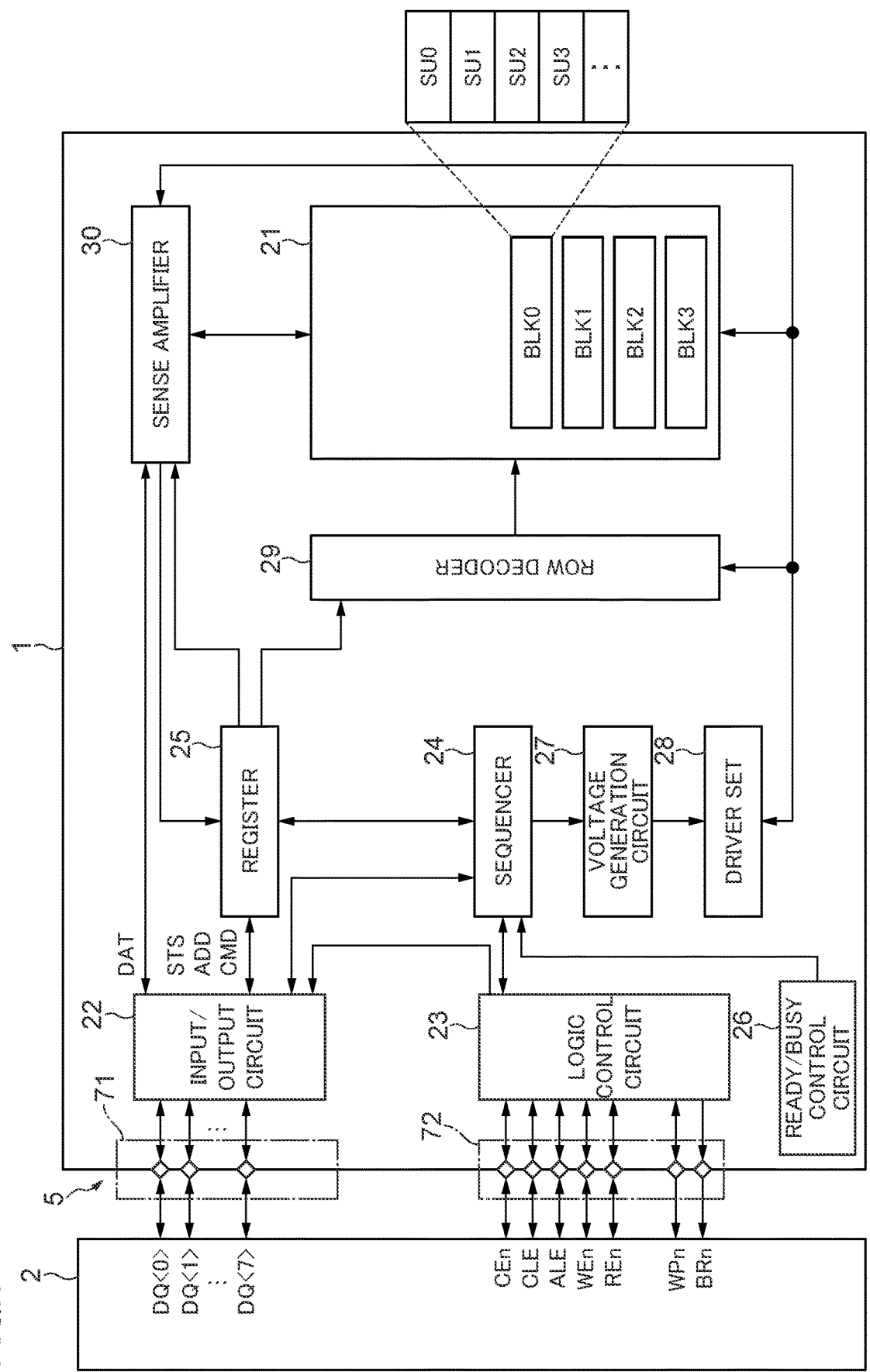
FIG. 1 is a block diagram showing the configuration of a memory system including a semiconductor memory device according to a first embodiment.

A semiconductor memory device of embodiments includes: a substrate; a memory pillar extending in a first direction from the substrate; a first conductive layer provided above the substrate, the first conductive layer being provided separately from the substrate in the first direction, the first conductive layer being provided in parallel with a substrate surface of the substrate, and the first conductive layer facing the memory pillar; a second conductive layer provided above the substrate, the second conductive layer being provided to be adjacent to the first conductive layer with the memory pillar interposed between the first conductive layer and the second conductive layer in a second direction crossing the first direction, the second conductive layer being provided in parallel with the substrate surface, and the second conductive layer facing the memory pillar; a third conductive layer provided between the substrate and the first conductive layer, the third conductive layer being provided in parallel with the substrate surface, and the third conductive layer facing the memory pillar; a fourth conductive layer provided between the substrate and the second conductive layer, the fourth conductive layer being provided to be adjacent to the third conductive layer with the memory pillar interposed between the third conductive layer and the fourth conductive layer in the second direction, the fourth conductive layer being provided in parallel with the substrate surface, and the fourth conductive layer facing the memory pillar; a fifth conductive layer provided above the first conductive layer, the fifth conductive layer being provided in parallel with the substrate surface, and the fifth conductive layer facing the memory pillar; a sixth conductive layer provided above the second conductive layer, the sixth conductive layer being provided to be adjacent to the fifth conductive layer with the memory pillar interposed between the fifth conductive layer and the sixth conductive layer in the second direction, the sixth conductive layer being provided in parallel with the substrate surface, and the sixth conductive layer facing the memory pillar; a first memory cell formed between the first conductive layer and the memory pillar; a second memory cell formed between the second conductive layer and the memory pillar; a third memory cell formed between the third conductive layer and the memory pillar; a fourth memory cell formed between the fourth conductive layer and the memory pillar; a fifth memory cell formed between the fifth conductive layer and the memory pillar; a sixth memory cell formed between the sixth conductive layer and the memory pillar; and a control circuit for applying a first voltage to the first conductive layer, the second conductive layer, and the sixth conductive layer and applying a second voltage higher than the first voltage to the third conductive layer and the fifth conductive layer, then applying a third voltage lower than the first voltage to the first conductive layer, applying a fourth voltage lower than the first voltage to the sixth conductive layer, and applying a fifth voltage lower than the first voltage to the second conductive layer, and then applying a sixth voltage higher than the third voltage and lower than the first voltage to the first conductive layer, applying a seventh voltage different from the fourth voltage and lower than the first voltage to the sixth conductive layer, and applying an eighth voltage lower than the fifth voltage to the second conductive layer.

Hereinafter, embodiments will be described with reference to the diagrams. In addition, in the diagrams, the same or similar elements are denoted by the same or similar reference numerals.

First Embodiment

FIG. 1 is a block diagram showing an example of the configuration of a memory system 3 including a semiconductor memory device 1 according to a first embodiment. The configuration of the memory system 3 including the semiconductor memory device 1 according to the first embodiment is not limited to the configuration shown in FIG. 1.

As shown in FIG. 1, the memory system 3 includes the semiconductor memory device 1 and a memory controller 2. The memory system 3 is, for example, a memory card such as a solid state drive (SSD) or an SD™ card. The memory system 3 may include a host device (not shown).

The semiconductor memory device 1 is connected to, for example, the memory controller 2 and is controlled by using the memory controller 2. The memory controller 2 receives, for example, an instruction necessary for the operation of the semiconductor memory device 1 from the host device, and transmits the instruction to the semiconductor memory device 1. The memory controller 2 transmits the instruction to the semiconductor memory device 1 to control the reading of data from the semiconductor memory device 1, writing of data into the semiconductor memory device 1, or erasing data in the semiconductor memory device 1. In the present embodiment, the semiconductor memory device 1 is, for example, a NAND flash memory.

As shown in FIG. 1, the semiconductor memory device 1 includes a memory cell array 21, an input/output circuit 22, a logic control circuit 23, a sequencer 24, a register 25, a ready/busy control circuit 26, a voltage generation circuit 27, a driver set 28, a row decoder 29, a sense amplifier 30, an input/output pad group 71, and a logic control pad group 72. In the semiconductor memory device 1, various operations, such as a write operation for storing write data DAT in the memory cell array 21 and a read operation for reading read data DAT from the memory cell array 21, are executed. The configuration of the semiconductor memory device 1 according to the present embodiment is not limited to the configuration shown in FIG. 1.

The memory cell array 21 is connected to, for example, the sense amplifier 30, the row decoder 29, and the driver set 28. The memory cell array 21 includes blocks BLK0, BLK1, . . . , BLKn (n is an integer of 1 or more). Although details will be described later, each block BLK includes a plurality of string units SU (SU0, SU1, SU2, . . . ). Each of the string units SU includes a plurality of non-volatile memory cells associated with bit lines and word lines. The block BLK is, for example, a data erasing unit. Data held by memory cell transistors MT (FIG. 2) included in the same block BLK is collectively erased.

In the semiconductor memory device 1, for example, a triple-level cell (TLC) method or a quadruple level cell (QLC) method can be applied. In the TLC method, 3-bit data is held in each memory cell, and in the QLC method, 4-bit data is held in each memory cell. In addition, data of 2 bits or less may be held in each memory cell, or data of 5 bits or more may be held.

The input/output circuit 22 is connected to, for example, the register 25, the logic control circuit 23, and the sense amplifier 30. The input/output circuit 22 controls the transmission and reception of a data signal DQ<7:0> between the memory controller 2 and the semiconductor memory device 1.

The data signal DQ<7:0> is an 8-bit signal. The data signal DQ<7:0> is an entity of data transmitted and received between the semiconductor memory device 1 and the memory controller 2, and includes a command CMD, data DAT, address information ADD, status information STS, and the like. The command CMD includes, for example, an instruction for executing an instruction transmitted from the host device (memory controller 2) to the semiconductor memory device 1. The data DAT includes the data DAT written into the semiconductor memory device 1 or the data DAT read from the semiconductor memory device 1. The address information ADD includes, for example, a column address and a row address for selecting a plurality of non-volatile memory cells associated with bit lines and word lines. The status information STS includes, for example, information regarding the status of the semiconductor memory device 1 regarding the write operation and the read operation.

More specifically, the input/output circuit 22 includes an input circuit and an output circuit, and the input circuit and the output circuit perform processing described below. The input circuit receives the write data DAT, the address information ADD, and the command CMD from the memory controller 2. The input circuit transmits the received write data DAT to the sense amplifier 30, and transmits the received address information ADD and command CMD to the register 25. On the other hand, the output circuit receives the status information STS from the register 25, and receives the read data DAT from the sense amplifier 30. The output circuit transmits the received status information STS and read data DAT to the memory controller 2.

The logic control circuit 23 is connected to, for example, the memory controller 2 and the sequencer 24. The logic control circuit 23 receives, for example, a chip enable signal CEn, a command latch enable signal CLE, an address latch enable signal ALE, a write enable signal WEn, a read enable signal REn, and a write protect signal WPn from the memory controller 2. The logic control circuit 23 controls the input/output circuit 22 and the sequencer 24 based on the received signals.

The chip enable signal CEn is a signal for enabling the semiconductor memory device 1. The command latch enable signal CLE is a signal for notifying the input/output circuit 22 that the signal DQ input to the semiconductor memory device 1 is the command CMD. The address latch enable signal ALE is a signal for notifying the input/output circuit 22 that the signal DQ input to the semiconductor memory device 1 is the address information ADD. The write enable signal WEn and the read enable signal REn are, for example, signals for instructing the input/output circuit 22 to input and output the data signal DQ, respectively. The write protect signal WPn is a signal for instructing the semiconductor memory device 1 to prohibit writing and erasing of data.

The sequencer 24 is connected to, for example, the ready/busy control circuit 26, the sense amplifier 30, and the driver set 28. The sequencer 24 controls the overall operation of the semiconductor memory device 1 based on the command CMD held in the command register. For example, the sequencer 24 controls the sense amplifier 30, the row decoder 29, the voltage generation circuit 27, the driver set 28, and the like to execute various operations, such as a write operation and a read operation.

The register 25 includes, for example, a status register (not shown), an address register (not shown), a command register (not shown), and the like. The status register receives the status information STS from the sequencer 24, holds the status information STS, and transmits the status information STS to the input/output circuit 22 based on the instruction of the sequencer 24. The address register receives the address information ADD from the input/output circuit 22 and holds the address information ADD. The address register transmits a column address in the address information ADD to the sense amplifier 30, and transmits a row address in the address information ADD to the row decoder 29. The command register receives the command CMD from the input/output circuit 22, holds the command CMD, and transmits the command CMD to the sequencer 24.

The ready/busy control circuit 26 generates a ready/busy signal R/Bn according to the control of the sequencer 24, and transmits the generated ready/busy signal R/Bn to the memory controller 2. The ready/busy signal R/Bn is a signal for notifying whether the semiconductor memory device 1 is in a ready state in which an instruction from the memory controller 2 is accepted or in a busy state in which no instruction is accepted.

The voltage generation circuit 27 is connected to, for example, the driver set 28 or the like. The voltage generation circuit 27 generates a voltage used for a write operation, a read operation, and the like based on the control of the sequencer 24, and supplies the generated voltage to the driver set 28.

Figure 12:
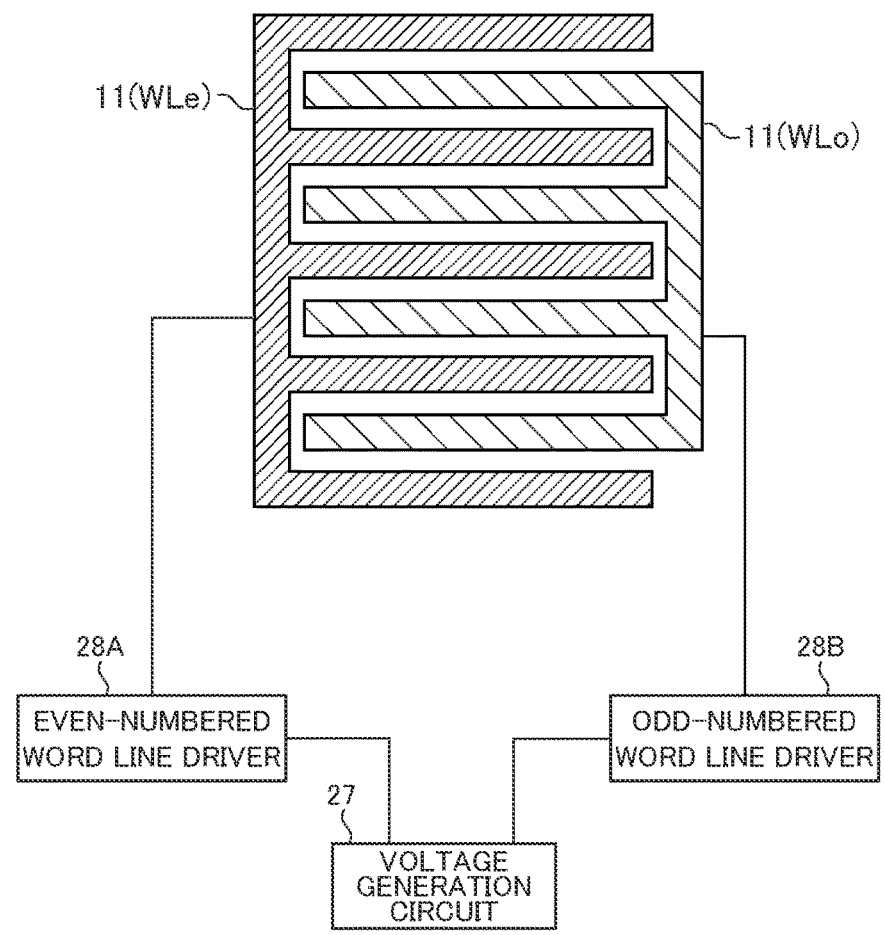
FIG. 12 is a diagram for describing the electrical connection of a voltage generation circuit, a driver set, a select gate line, and a word line according to the first embodiment.

The driver set 28 includes, for example, an even-numbered word line driver 28A (FIG. 12) and an odd-numbered word line driver 28B (FIG. 12). The driver set 28 is connected to the memory cell array 21, the sense amplifier 30, and the row decoder 29. Based on the voltage supplied from the voltage generation circuit 27, the driver set 28 generates various voltages to be applied to a select gate line SGD (FIG. 2), a word line WL (FIG. 2), a source line SL (FIG. 2), and the like in various operations such as a read operation and a write operation (FIG. 2), for example. The driver set 28 supplies the generated voltage to the even-numbered word line driver 28A, the odd-numbered word line driver 28B, the sense amplifier 30, the row decoder 29, the source line SL, and the like.

The row decoder 29 receives a row address from the address register and decodes the received row address. The row decoder 29 selects a block BLK, in which various operations such as a read operation and a write operation are to be executed, based on the decoding result. The row decoder 29 can supply the voltage supplied from the driver set 28 to the selected block BLK.

The sense amplifier 30 receives a column address from the address register and decodes the received column address, for example. In addition, the sense amplifier 30 executes an operation of transmitting and receiving the data DAT between the memory controller 2 and the memory cell array 21 based on the decoding result. The sense amplifier 30 includes, for example, a sense amplifier unit (not shown) provided for each bit line. The sense amplifier 30 makes it possible to supply a voltage to the bit line BL by using the sense amplifier unit. For example, the sense amplifier 30 can supply a voltage to a bit line by using a sense amplifier unit. In addition, the sense amplifier 30 senses the data read from the memory cell array 21, generates the read data DAT, and transmits the generated read data DAT to the memory controller 2 through the input/output circuit 22. In addition, the sense amplifier 30 receives the write data DAT from the memory controller 2 through the input/output circuit 22, and transmits the received write data DAT to the memory cell array 21.

The input/output pad group 71 transmits the data signal DQ<7:0> received from the memory controller 2 to the input/output circuit 22. The input/output pad group 71 transmits the data signal DQ<7:0> received from the input/output circuit 22 to the memory controller 2.

The logic control pad group 72 transmits the chip enable signal CEn, the command latch enable signal CLE, the address latch enable signal ALE, the write enable signal WEn, and the read enable signal REn received from the memory controller 2 to the logic control circuit 23. The logic control pad group 72 transmits the ready/busy signal R/Bn received from the ready/busy control circuit 26 to the memory controller 2.

Figure 2:
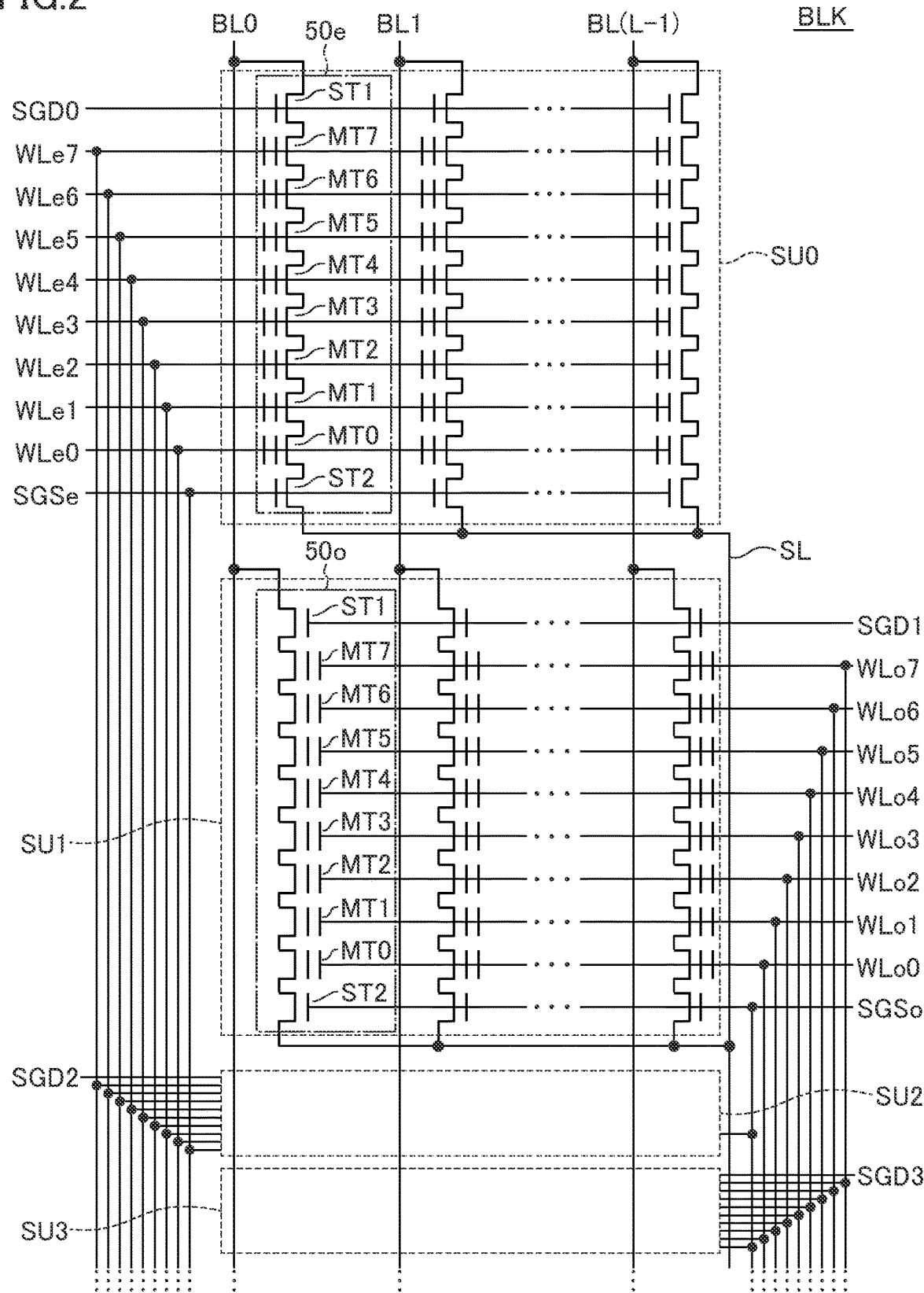
FIG. 2 is a schematic diagram showing the circuit configuration of a memory cell array in the semiconductor memory device according to the first embodiment.

FIG. 2 is an example of the circuit configuration of the memory cell array 21 shown in FIG. 1. FIG. 2 is a diagram showing the circuit configuration of one block BLK among a plurality of blocks BLK included in the memory cell array 21. For example, each of the plurality of blocks BLK included in the memory cell array 21 has the circuit configuration shown in FIG. 2. The configuration of the memory cell array 21 according to the present embodiment is not limited to the configuration shown in FIG. 2. In the description of FIG. 2, the description of the same or similar configuration as that of FIG. 1 may be omitted.

As shown in FIG. 2, the block BLK includes a plurality of string units SU (SU0, SU1, SU2, SU3). In the present embodiment, the write operation and the read operation are executed in units of the string unit SU (page). Each of the string units SU includes a plurality of NAND strings 50. For example, the string units SU0 and SU2 include a plurality of NAND strings 50e, and the string units SU1 and SU3 include a plurality of NAND strings 50o. In addition, although FIG. 2 shows an example in which each block BLK includes four string units SU0, SU1, SU2, and SU3, the number of string units included in each block is not limited to four. For example, each block BLK may include six or eight string units.

Each of the NAND strings 50 includes, for example, eight memory cell transistors MT (MT0 to MT7) and selection transistors ST1 and ST2. Each memory cell transistor MT includes a control gate and a charge storage layer, and holds data in a non-volatile manner. The memory cell transistors MT are connected in series between the source of the selection transistor ST1 and the drain of the selection transistor ST2.

The gate of the selection transistor ST1 in each of the string units SU is connected to the select gate line SGD (SGD0, SGD1, . . . ). The select gate line SGD is independently controlled by the row decoder 29. In addition, the gate of the selection transistor ST2 in each of the even-numbered string units SUe (SU0, SU2, is connected to, for example, an even-numbered select gate line SGSe, and the gate of the selection transistor ST2 in each of the odd-numbered string unit SUo (SU1, SU3, . . . ) is connected to, for example, an odd-numbered select gate line SGSo. The even-numbered select gate line SGSe and the odd-numbered select gate line SGSo may be connected to each other so as to be controlled in the same manner or may be independently provided so as to be independently controllable, for example.

The control gates of the memory cell transistors MT (MT0 to MT7) included in the string unit SUe in the same block BLK are commonly connected to a word line WLe (WLe0 to WLe7). The control gates of the memory cell transistors MT (MT0 to MT7) included in the string unit SUo in the same block BLK are commonly connected to a word line WLo (WLo0 to WLo7). The word line WLe and the word line WLo are independently controlled by the row decoder 29.

The drains of the selection transistor ST1 of the NAND strings 50 in the same row in the memory cell array 21 are commonly connected to the bit line BL (BL0 to BL(L−1), where (L−1) is a natural number of 2 or more). That is, in the bit line BL, the NAND string 50 is commonly connected between the plurality of string units SU. The sources of the plurality of selection transistors ST2 are commonly connected to the source line SL. For example, the source line SL is electrically connected to the driver set 28, and a voltage is supplied from the voltage generation circuit 27 or the driver set 28 under the control of the voltage generation circuit 27 and the driver set 28 using the sequencer 24. In addition, the semiconductor memory device 1 according to the embodiment may include a plurality of source lines SL. For example, each of the plurality of source lines SL may be electrically connected to the driver set 28, so that different voltages are supplied from the voltage generation circuit 27 and the driver set 28 to each of the plurality of source lines SL under the control of the voltage generation circuit 27 and the driver set 28 using the sequencer 24.

The string unit SU includes a plurality of NAND strings 50 connected to different bit lines BL and connected to the same select gate line SGD. The block BLK includes a plurality of string units SU having the common word line WL. The memory cell array 21 includes a plurality of blocks BLK having the common bit line BL. In the memory cell array 21, the above-described select gate line SGS, word line WL, and select gate line SGD are stacked above the source line layer, and the memory cell transistor MT is stacked in a three-dimensional manner.

Figure 3:
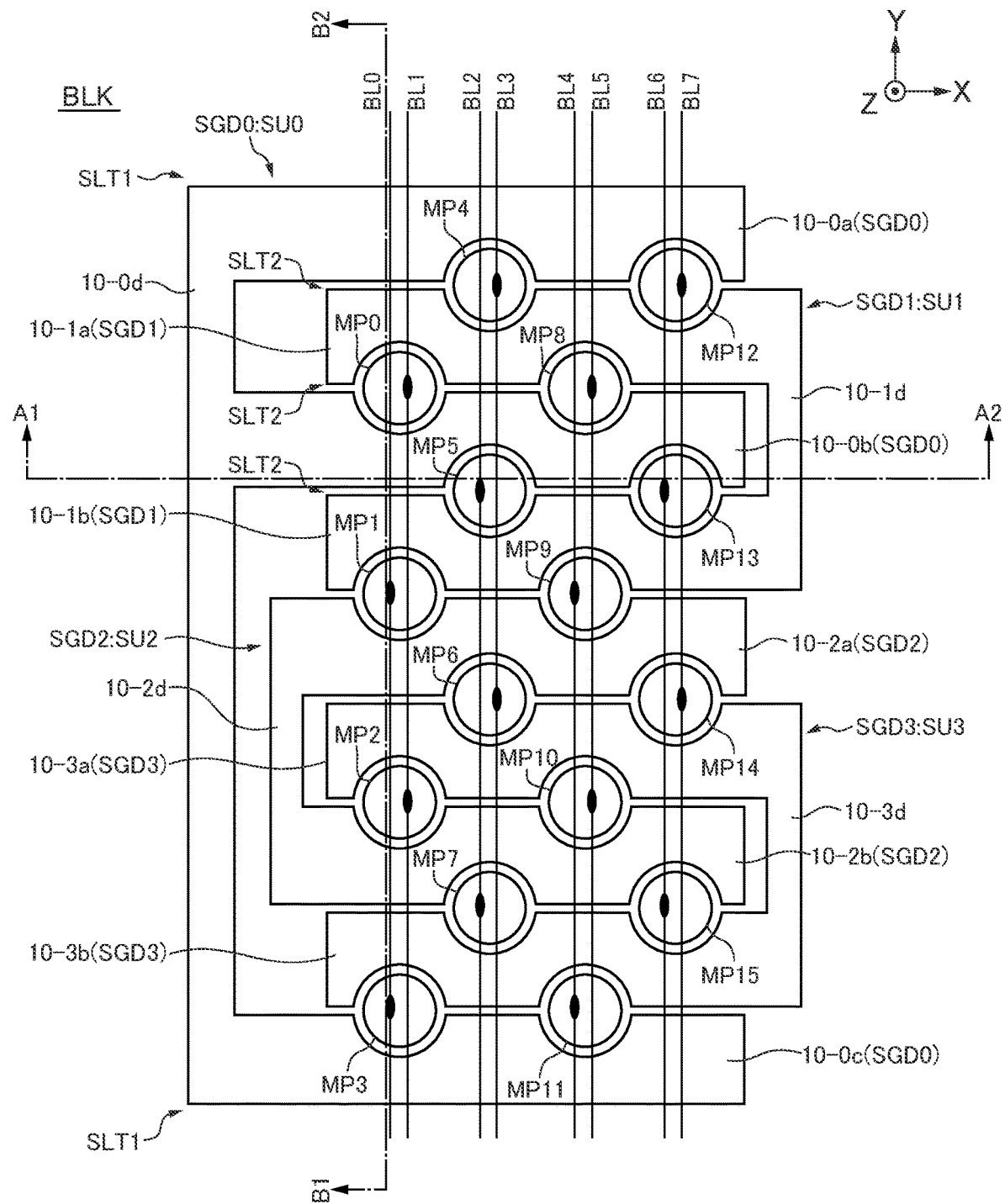
FIG. 3 is a schematic diagram showing the planar layout of select gate lines, bit lines, and memory pillars according to the first embodiment.

FIG. 3 is a diagram showing the planar layout of the select gate lines SGD on a plane (XY plane) parallel to the source line layer of a predetermined block BLK. As shown in FIG. 3, in the semiconductor memory device 1 according to the present embodiment, for example, four select gate lines SGD are included in one block BLK. The planar layout of the select gate lines SGD according to the embodiment is not limited to the layout shown in FIG. 3. In the description of FIG. 3, the description of the same or similar configuration as that of FIGS. 1 and 2 may be omitted.

As shown in FIG. 3, in the semiconductor memory device 1 according to the present embodiment, for example, three wiring layers 10-0a, 10-0b, and 10-0c extending in the X direction are connected to each other using a first connection portion 10-0d extending in the Y direction. The wiring layers 10-0a and 10-0c are located at both ends in the Y direction. The wiring layer 10-0a and the wiring layer 10-0b are adjacent to each other in the Y direction with another wiring layer (wiring layer 10-1a) interposed between the wiring layer 10-0a and the wiring layer 10-0b. The first connection portion 10-0d is located at one end in the X direction. The three wiring layers 10-0a, 10-0b, and 10-0c function as the select gate line SGD0. In the present embodiment, for example, the Y direction is a direction perpendicular or approximately perpendicular to the X direction.

The wiring layers 10-1a and 10-1b extending in the X direction are connected to each other using a second connection portion 10-1d extending in the Y direction. The wiring layer 10-1a is located between the wiring layers 10-0a and 10-0b. The wiring layer 10-1b is located between the wiring layer 10-0b and another wiring layer (wiring layer 10-2a). The second connection portion 10-1d is located at the other end of the first connection portion 10-0d on the opposite side in the X direction. The two wiring layers 10-1a and 10-1b function as the select gate line SGD1.

The wiring layers 10-2a and 10-2b extending in the X direction are connected to each other by a first connection portion 10-2d extending in the Y direction. Similarly, wiring layers 10-3a and 10-3b extending in the X direction are connected to each other by a second connection portion 10-3d extending in the Y direction. The wiring layer 10-2a is located between the wiring layer 10-1b and the wiring layer 10-3a. The wiring layer 10-3a is located between the wiring layer 10-2a and the wiring layer 10-2b. The wiring layer 10-2b is located between the wiring layer 10-3a and the wiring layer 10-3b. The wiring layer 10-3b is located between the wiring layer 10-2b and the wiring layer 10-0c. The first connection portion 10-2d is located at one end on the same side as the first connection portion 10-0d in the X direction. The second connection portion 10-3d is located at the other end of the first connection portion 10-0d on the opposite side in the X direction. The two wiring layers 10-2a and 10-2b function as the select gate line SGD2. The two wiring layers 10-3a and 10-3b function as the select gate line SGD3.

In the present embodiment, a configuration is exemplified in which the respective wiring layers are connected to each other using the first connection portions 10-0d and 10-2d or the second connection portions 10-1d and 10-3d. However, embodiments are not limited to this configuration. For example, each wiring layer is independent, and is controlled such that the same voltage is supplied to the wiring layers 10-0a, 10-0b, and 10-0c, the same voltage is supplied to the wiring layers 10-1a and 10-1b, the same voltage is supplied to the wiring layers 10-2a and 10-2b, and the same voltage is supplied to the wiring layers 10-3a and 10-3b.

The string unit SU including the NAND string 50e of a memory pillar MP adjacent to the wiring layers 10-0a, 10-0b, and 10-0c is called SU0. The string unit SU including the NAND string 50o of the memory pillar MP adjacent to the wiring layers 10-1a and 10-1b is called SU1. The string unit SU including the NAND string 50e of the memory pillar MP adjacent to the wiring layers 10-2a and 10-2b is called SU2. The string unit SU including the NAND string 50o of the memory pillar MP adjacent to the wiring layers 10-3a and 10-3b is called SU3.

The wiring layers 10 adjacent to each other in the Y direction in the block BLK are insulated. The region that insulates the adjacent wiring layers 10 is called a slit SLT2. In the slit SLT2, for example, a region from a surface parallel to the source line layer to at least a layer in which the wiring layer 10 is provided is embedded by using an insulating film (not shown). In addition, in the memory cell array 21, for example, a plurality of blocks BLK shown in FIG. 3 are disposed in the Y direction. Similar to the wiring layers 10 adjacent to each other in the Y direction in the block BLK, a region between the blocks BLK adjacent to each other in the Y direction is embedded by using an insulating film (not shown), so that the blocks BLK adjacent to each other in the Y direction are also insulated from each other. The region that insulates the adjacent blocks BLK is called a slit SLT1. Similar to the slit SLT2, in the slit SLT1, a region from a surface parallel to the source line layer to at least a layer in which the wiring layer 10 is provided is embedded by the insulating film.

A plurality of memory pillars MP (MP0 to MP15) are provided between the wiring layers 10 adjacent to each other in the Y direction. The plurality of memory pillars MP are provided in a memory cell portion. Each of the plurality of memory pillars MP is provided along the Z direction. In the embodiment, for example, the Z direction is a direction perpendicular or approximately perpendicular to the X and Y directions, and is a direction perpendicular or approximately perpendicular to the direction parallel to the source line layer. The Z direction is an example of the first direction. The Y direction is an example of the second direction.

Specifically, the memory pillars MP4 and MP12 are provided between the wiring layers 10-0a and 10-1a. The memory pillars MP0 and MP8 are provided between the wiring layers 10-1a and 10-0b. The memory pillars MP5 and MP13 are provided between the wiring layers 10-0b and 10-1b. The memory pillars MP1 and MP9 are provided between the wiring layers 10-1b and 10-2a. The memory pillars MP6 and MP14 are provided between the wiring layers 10-2a and 10-3a. The memory pillars MP2 and MP10 are provided between the wiring layers 10-3a and 10-2b. The memory pillars MP7 and MP15 are provided between the wiring layers 10-2b and 10-3b. The memory pillars MP3 and MP11 are provided between the wiring layers 10-3b and 10-0c.

The memory pillar MP is a structure that forms the selection transistor ST1 and ST2 and the memory cell transistor MT. The detailed structure of the memory pillar MP will be described later.

The memory pillars MP0 to MP3 are disposed along the Y direction. The memory pillars MP8 to MP11 are disposed along the Y direction at positions adjacent to the memory pillars MP0 to MP3 in the X direction. That is, the memory pillars MP0 to MP3 and the memory pillars MP8 to MP11 are disposed in parallel.

The memory pillars MP4 to MP7 and the memory pillars MP12 to MP15 are disposed along the Y direction. The memory pillars MP4 to MP7 are located between the memory pillars MP0 to MP3 and the memory pillars MP8 to MP11 in the X direction. The memory pillars MP12 to MP15 are located so as to interpose the memory pillars MP8 to MP11 between the memory pillars MP12 to MP15 and the memory pillars MP4 to MP7 in the X direction. That is, the memory pillars MP4 to MP7 and the memory pillars MP12 to MP15 are disposed in parallel.

Two bit lines BL0 and BL1 are provided above the memory pillars MP0 to MP3. The bit line BL0 is commonly connected to the memory pillars MP1 and MP2. The bit line BL1 is commonly connected to the memory pillars MP0 and MP3. Two bit lines BL2 and BL3 are provided above the memory pillars MP4 to MP7. The bit line BL2 is commonly connected to the memory pillars MP4 and MP5. The bit line BL3 is commonly connected to the memory pillars MP6 and MP7.

Two bit lines BL4 and BL5 are provided above the memory pillars MP8 to MP11. The bit line BL4 is commonly connected to the memory pillars MP9 and MP10. Two bit lines BL6 and BL7 are provided above the memory pillars MP12 to MP15. The bit line BL6 is commonly connected to the memory pillars MP12 and MP13. The bit line BL7 is commonly connected to the memory pillars MP14 and MP15.

As described above, the memory pillar MP is provided at a position across the two wiring layers 10 in the Y direction, and is provided so as to be embedded in a part of one of the plurality of slits SL2. In addition, one slit SLT2 is provided between the memory pillars MP adjacent to each other in the Y direction.

In addition, the memory pillar MP is not provided between the wiring layers 10-0a and the wiring layers 10-0b adjacent to each other with the slit SLT1 interposed between the wiring layers 10-0a and the wiring layers 10-0b.

Figure 4:
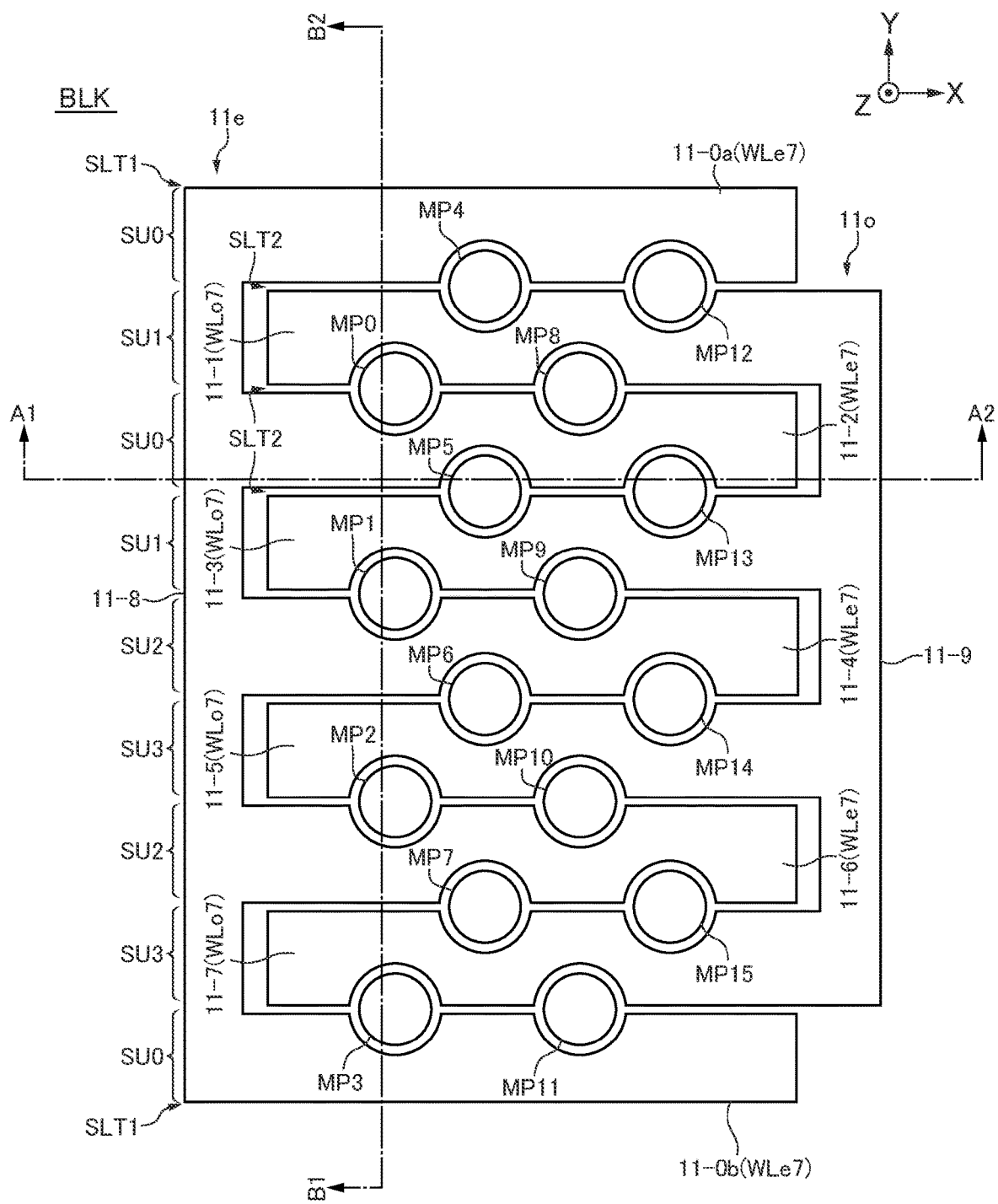
FIG. 4 is a schematic diagram showing the planar layout of word lines and memory pillars according to the first embodiment.

FIG. 4 is a diagram showing the planar layout of the word lines WL on the XY plane. The layout shown in FIG. 4 corresponds to the layout of a region of one block in FIG. 3, and is the layout of a wiring layer 11 provided below the wiring layer 10 shown in FIG. 3. The planar layout of the word lines WL according to the embodiment is not limited to the layout shown in FIG. 4. In the description of FIG. 4, the description of the same or similar configuration as that of FIGS. 1 to 3 may be omitted.

As shown in FIG. 4, nine wiring layers 11 (wiring layers 11-0 to 11-7, where the wiring layer 11-0 includes a wiring layer 11-0a and a wiring layer 11-0b) extending in the X direction are disposed along the Y direction. The wiring layers 11-0 to 11-7 are disposed below the wiring layers 10-0 to 10-7 in the Z direction, respectively. An insulating film is provided between the wiring layers 11-0 to 11-7 and the wiring layers 10-0 to 10-7, so that the wiring layers 11-0 to 11-7 and the wiring layers 10-0 to 10-7 are insulated from each other.

Each wiring layer 11 functions as a word line WL7. The other word lines WL0 to WL6 also have the same configuration and function as the word line WL7. In the example shown in FIG. 4, the wiring layers 11-0a, 11-2, 11-4, 11-6, and 11-0b function as the word line WLe7. The wiring layers 11-0a, 11-2, 11-4, 11-6, and 11-0b are connected to each other using a first connection portion 11-8 extending in the Y direction. The first connection portion 11-8 is provided at one end in the X direction. In the first connection portion 11-8, the wiring layers 11-0a, 11-2, 11-4, 11-6, and 11-0b are connected to the row decoder 29. In the embodiment, the first connection portion 11-8 and the wiring layers 11-0a, 11-2, 11-4, 11-6, and 11-0b may be collectively referred to as a wiring layer 11e.

In addition, the wiring layers 11-1, 11-3, 11-5, and 11-7 function as the word line WLo7. The wiring layers 11-1, 11-3, and 11-5 and the wiring layer 11-7 are connected to each other using a second connection portion 11-9 extending in the Y direction. The second connection portion 11-9 is provided at the other end of the first connection portion 11-8 on the opposite side in the X direction. In the second connection portion 11-9, the wiring layers 11-1, 11-3, 11-5, and 11-7 are connected to the row decoder 29. In the embodiment, the second connection portion 11-9 and the wiring layers 11-1, 11-3, 11-5, and 11-7 may be collectively referred to as a wiring layer 11o.

A memory cell portion is provided between the first connection portion 11-8 and the second connection portion 11-9. In the memory cell portion, the wiring layers 11 adjacent to each other in the Y direction may be spaced apart from each other by the slit SLT2 shown in FIG. 3. In addition, the wiring layer 11 between the blocks BLK adjacent to each other in the Y direction is spaced apart from each other by the slit SLT1 as in the case using the slit SLT2. As in FIG. 3, the memory cell portion includes memory pillars MP0 to MP15.

The select gate line SGS and the word lines WL0 to WL6 have the same configuration as the word line WL7 shown in FIG. 4.

Figure 5:
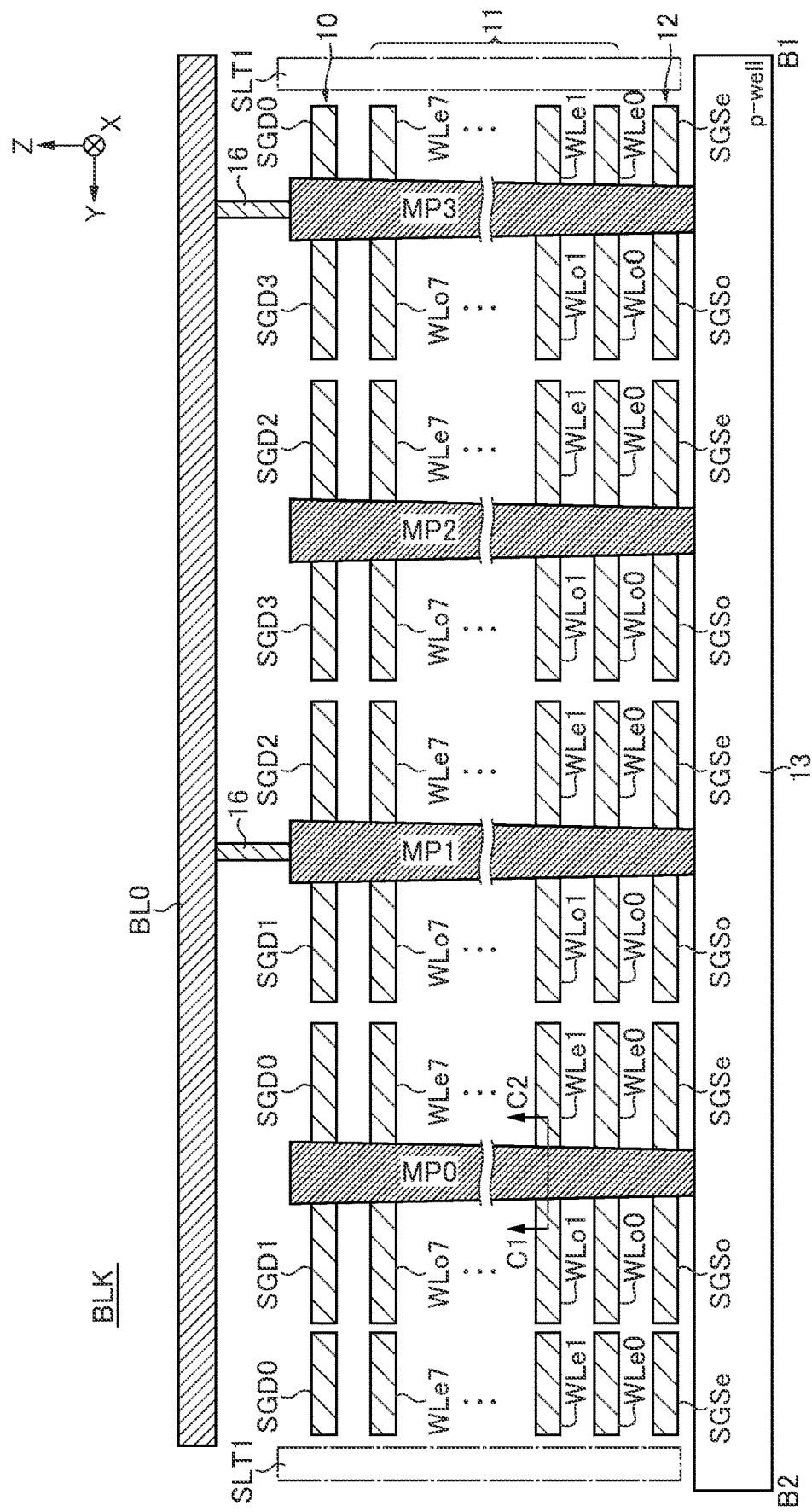
FIG. 5 is a cross-sectional view of a B1-B2 cut portion of the semiconductor memory device shown in FIGS. 3 and 4.

FIG. 5 is a cross-sectional view of a B1-B2 cut portion shown in FIG. 4. The cross-sectional view of the cut portion of the block BLK according to the present embodiment is not limited to the cross-sectional view of the cut portion shown in FIG. 5. In the description of FIG. 5, the description of the same or similar configuration as that of FIGS. 1 to 4 may be omitted.

As shown in FIG. 5, a wiring layer 12 is provided above a source line layer 13 along the Z direction. The source line layer 13 functions as the source line SL. In addition, the wiring layer 12 may be provided on a p-type well region in a semiconductor substrate (substrate) instead of the source line layer 13 shown in FIG. 5. In this case, the source line SL is electrically connected to the p-type well region in the semiconductor substrate. The wiring layer 12 functions as the select gate line SGS. Eight-layer wiring layers 11 are stacked above the wiring layer 12 along the Z direction. The wiring layer 11 functions as the word line WL. In addition, the eight-layer wiring layers 11 correspond to the word lines WL0 to WL7 on a one-to-one basis. FIG. 4 is a diagram showing the planar layout of the wiring layer 11 that functions as the word line WL, and FIG. 3 is a diagram showing the planar layout of the wiring layer 10 that functions as the select gate line SGD. The planar layout of the wiring layer 12 that functions as the select gate line SGS is, for example, a layout in which the wiring layer 10 that functions as the select gate line SGD shown in FIG. 3 is replaced with the wiring layer 12 that functions as the select gate line SGS.

The wiring layer 12 functions as the even-numbered select gate line SGSe or the odd-numbered select gate line SGSo. The even-numbered select gate line SGSe and the odd-numbered select gate line SGSo are alternately disposed in the Y direction with the slit SLT2 interposed between the even-numbered select gate line SGSe and the odd-numbered select gate line SGSo. The memory pillar MP is provided between the even-numbered select gate line SGSe and the odd-numbered select gate line SGSo adjacent to each other in the Y direction.

The wiring layer 11 functions as the even-numbered word line WLe or the odd-numbered word line WLo. The even-numbered word line WLe and the odd-numbered word line WLo are alternately disposed in the Y direction with the slit SLT2 interposed between the even-numbered word line WLe and the odd-numbered word line WLo. The memory pillar MP is provided between the word lines WLe and WLo adjacent to each other in the Y direction. A memory cell, which will be described later, is provided between the memory pillar MP and the word line WLe and between the memory pillar MP and the word line WLo.

The slit SLT1 is provided between the blocks BLK adjacent to each other in the Y direction. As described above, an insulating layer is provided in the slit SLT1. However, a contact plug or a groove-like structure formed by using a conductor may be provided in the slit SLT1 that is an insulator. When a contact plug or groove-like structure formed by using a conductor is provided in the slit SLT 1, a voltage can be applied to the source line layer 13. In addition, the width of the slit SLT1 along the Y direction is larger than the width of the slit SLT2 along the Y direction.

As shown in FIGS. 3 and 5, the memory pillar MP is electrically connected to the bit line BL. For example, the memory pillar MP0 and the bit line BL1 are connected to each other through a contact plug 16. In addition, the memory pillar MP1 and the bit line BL0 are connected to each other through the contact plug 16, the memory pillar MP2 and the bit line BL1 are connected to each other through the contact plug 16, and the memory pillar MP3 and the bit line BL0 are connected to each other through the contact plug 16. Similarly, each of the memory pillars MP4 to MP7 is connected to the bit line BL2 or BL3, each of the memory pillars MP8 to MP11 is connected to the bit line BL4 or BL5, and each of the memory pillars MP12 to MP15 is connected to the bit line BL6 or BL7.

Figure 6:
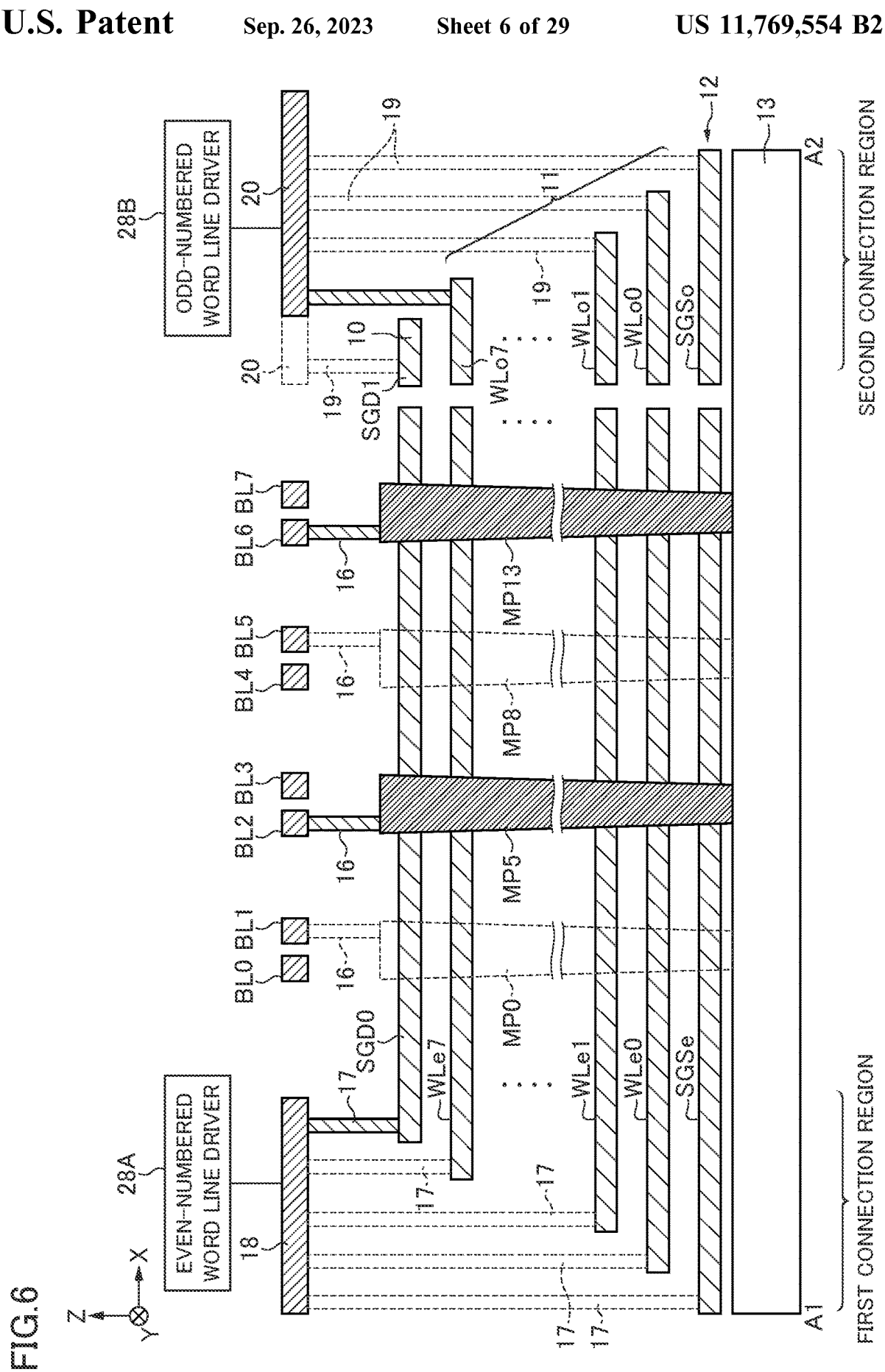
FIG. 6 is a cross-sectional view of an A1-A2 cut portion of the semiconductor memory device shown in FIGS. 3 and 4.

FIG. 6 is a cross-sectional view of an A1-A2 cut portion of the semiconductor memory device shown in FIG. 3. The cross-sectional view of the cut portion of the block BLK according to the embodiment is not limited to the cross-sectional view of the cut portion shown in FIG. 6. In the description of FIG. 6, the description of the same or similar configuration as that of FIGS. 1 to 5 may be omitted. Since the stacked structure of the source line layer 13, the wiring layer 12, the wiring layer 11, and the wiring layer 10 and the configuration of the memory cell portion are the same as those described with reference to FIG. 5, the description herein will be omitted. In addition, in FIG. 6, a configuration present in the depth direction of the cross-sectional view of the A1-A2 cut portion is drawn by a dotted line.

As shown in FIG. 6, in the first connection region, the wiring layer 10, the wiring layer 11, and the wiring layer 12 are provided, for example, in a stepped shape and are drawn out from the source line layer 13. That is, when viewed on the XY plane, the upper surfaces of end portions of each of the wiring layer 10, the eight-layer wiring layers 11, and the wiring layer 12 are exposed in the first connection region. A contact plug 17 is provided on the upper surface of the end portion of each of the wiring layer 10, the eight-layer wiring layers 11, and the wiring layer 12 exposed in the first connection region. The contact plug 17 is connected to a metal wiring layer 18. For example, using the metal wiring layer 18, the wiring layer 10 that functions as the even-numbered select gate lines SGD0 and SGD2, the wiring layer 11 that functions as the even-numbered word line WLe, and the wiring layer 12 that functions as the even-numbered select gate line SGSe are electrically connected to the even-numbered word line driver 28A through the row decoder 29 (FIG. 1).

Similar to the first connection region, in the second connection region, the wiring layer 10, the wiring layer 11, and the wiring layer 12 are provided, for example, in a stepped shape and are drawn out from the source line layer 13. When viewed on the XY plane, the upper surfaces of end portions of each of the wiring layer 10, the eight-layer wiring layers 11, and the wiring layer 12 are exposed in the second connection region. A contact plug 19 is provided on the upper surface of the end portion of each of the wiring layer 10, the eight-layer wiring layers 11, and the wiring layer 12 exposed in the second connection region, and the contact plug 19 is connected to a metal wiring layer 20. For example, using the metal wiring layer 20, the odd-numbered select gate lines SGD1 and SGD3, the wiring layer 11 that functions as the odd-numbered word line WLo, and the wiring layer 12 that functions as the odd-numbered select gate line SGSo are electrically connected to the odd-numbered word line driver 28B through the row decoder 29 (FIG. 1).

The wiring layer 10 may be electrically connected to the row decoder 29 or the even-numbered word line driver 28A and the odd-numbered word line driver 28B through the second connection region instead of the first connection region, or may be electrically connected to the row decoder 29 or the even-numbered word line driver 28A and the odd-numbered word line driver 28B through both the first connection region and the second connection region.

Figure 7:
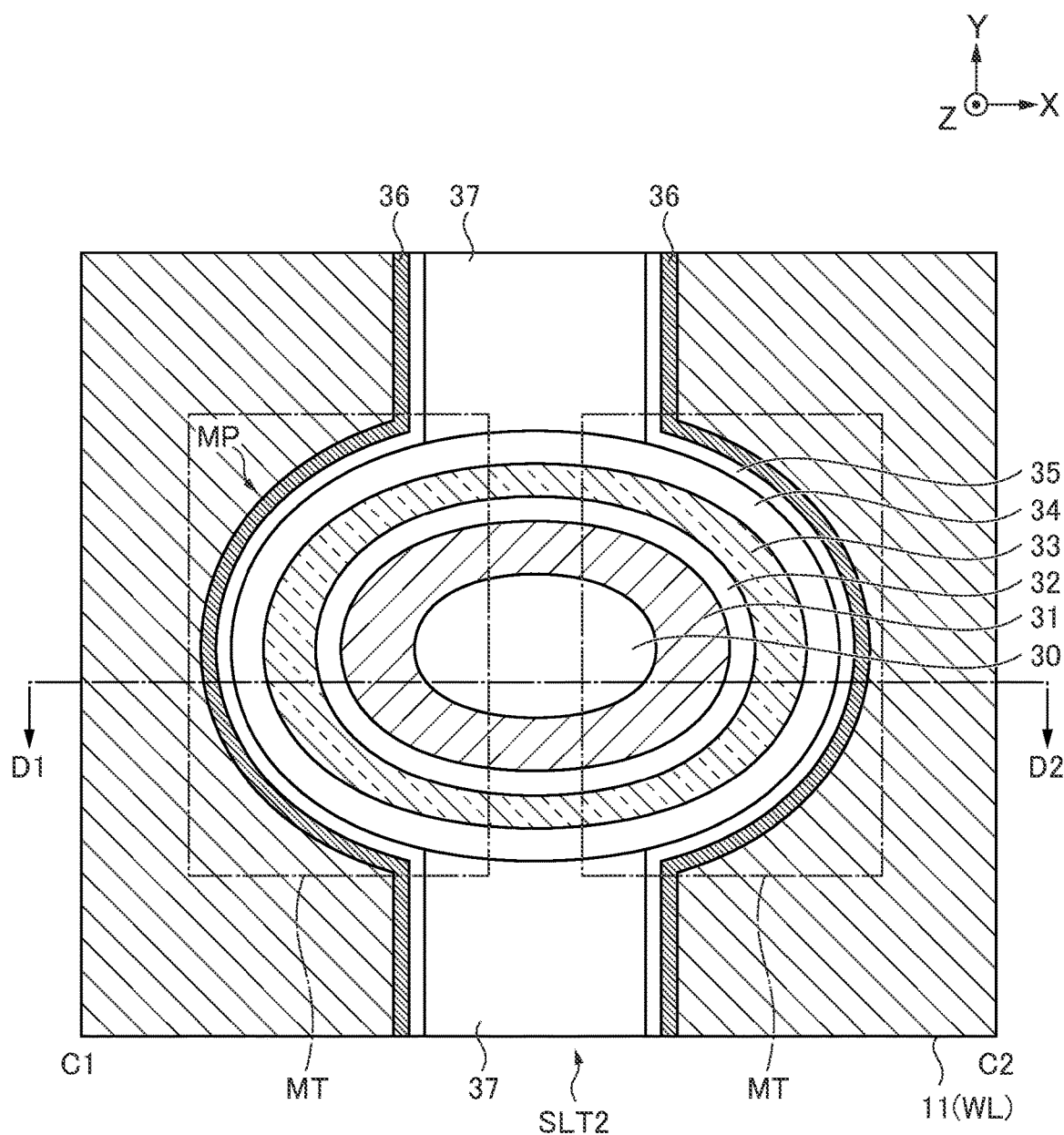
FIG. 7 is a cross-sectional view of a C1-C2 cut portion of a memory cell transistor shown in FIG. 5.
Figure 8:
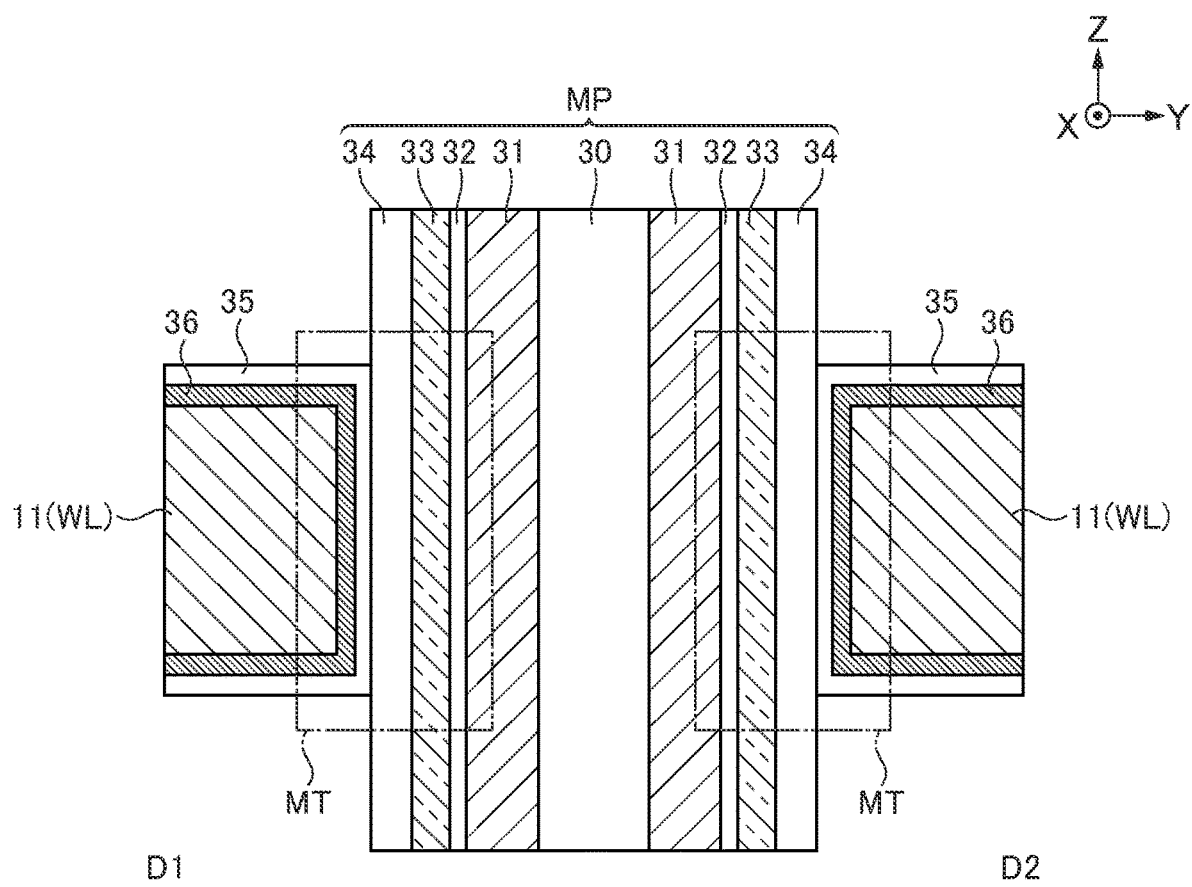
FIG. 8 is a cross-sectional view of a D1-D2 cut portion of the memory cell transistor shown in FIG. 7.

FIG. 7 is a cross-sectional view of a C1-C2 cut portion of the memory cell transistor according to the present embodiment, and FIG. 8 is a cross-sectional view of a D1-D2 cut portion of the memory cell transistor shown in FIG. 7. FIGS. 7 and 8 are cross-sectional views of cut portions, each of which shows a region including two memory cell transistors MT. In the first example, the charge storage layer included in the memory cell transistor MT is an insulating film. The first example of the memory cell transistor according to the present embodiment is not limited to the structures shown in FIGS. 7 and 8. In the description of FIGS. 7 and 8, the description of the same or similar configuration as that of FIGS. 1 to 6 may be omitted.

As shown in FIGS. 7 and 8, the memory pillar MP includes an insulating layer 30 (an example of an insulator), a semiconductor layer 31, and insulating layers 32 to 34, all of which are provided along the Z direction. The insulating layer 30 is formed by using, for example, a silicon oxide film. The semiconductor layer 31 is provided so as to surround the insulating layer 30, and functions as a region where a channel of the memory cell transistor MT is formed.

The semiconductor layer 31 (an example of the first channel and the second channel) is formed by using, for example, a polycrystalline silicon layer. The semiconductor layer 31 is not separated between the memory cell transistors MT in the same memory pillar MP, but is provided continuously. Therefore, the channels formed in the two memory cell transistors MT share a part of the memory pillar MP.

As described above, the semiconductor layer 31 is continuous between the two memory cell transistors MT facing each other. Therefore, the channels formed in the two memory cell transistors MT facing each other share a part of the memory pillar MP. Specifically, in FIGS. 7 and 8, in the left memory cell transistor MT and the right memory cell transistor MT facing each other, the channel formed in the first memory cell and the channel formed in the second memory cell share a part of the memory pillar MP. Here, the fact that the two channels share a part of the memory pillar MP means that the two channels are formed in the same memory pillar MP and the two channels partially overlap. In the embodiment, in the above configuration, the two memory cell transistors MT may share the channel, or the two memory cell transistors MT may face each other.

The insulating layer 32 is provided so as to surround the semiconductor layer 31, and functions as a gate insulating film of the memory cell transistor MT. The insulating layer 32 is formed by using, for example, a stacked structure of a silicon oxide film and a silicon nitride film. The insulating layer 33 is provided so as to surround the semiconductor layer 31, and functions as a charge storage layer of the memory cell transistor MT. The insulating layer 33 is formed by using, for example, a silicon nitride film. The insulating layer 34 is provided so as to surround the insulating layer 33, and functions as a block insulating film of the memory cell transistor MT. The insulating layer 34 is formed by using, for example, a silicon oxide film. The insulating layer 37 is embedded in the slit SLT2 excluding the memory pillar MP portion. The insulating layer 37 is formed by using, for example, a silicon oxide film. The insulating layer 33 (charge storage layer, charge storage film) of the left memory cell transistor MT (first memory cell) and the insulating layer (charge storage layer, charge storage film) of the right memory cell transistor MT (second memory cell) facing each other are connected to each other by, for example, the insulating layer 33 (film) containing a silicon nitride film.

In the first example of the embodiment, for example, an AlO layer 35 is provided around the memory pillar MP. For example, a barrier metal layer 36 is provided around the AlO layer 35. The barrier metal layer 36 is formed by using, for example, a TiN film. The wiring layer 11 that functions as the word line WL is provided around the barrier metal layer 36. The wiring layer 11 is formed by using, for example, a film formed of tungsten.

Therefore, one memory pillar MP includes two memory cell transistors MT and MT or two selection transistor ST1 and ST2 along the Y direction at a predetermined position on the Z axis.

1-6-2. Second Example

Figure 9:
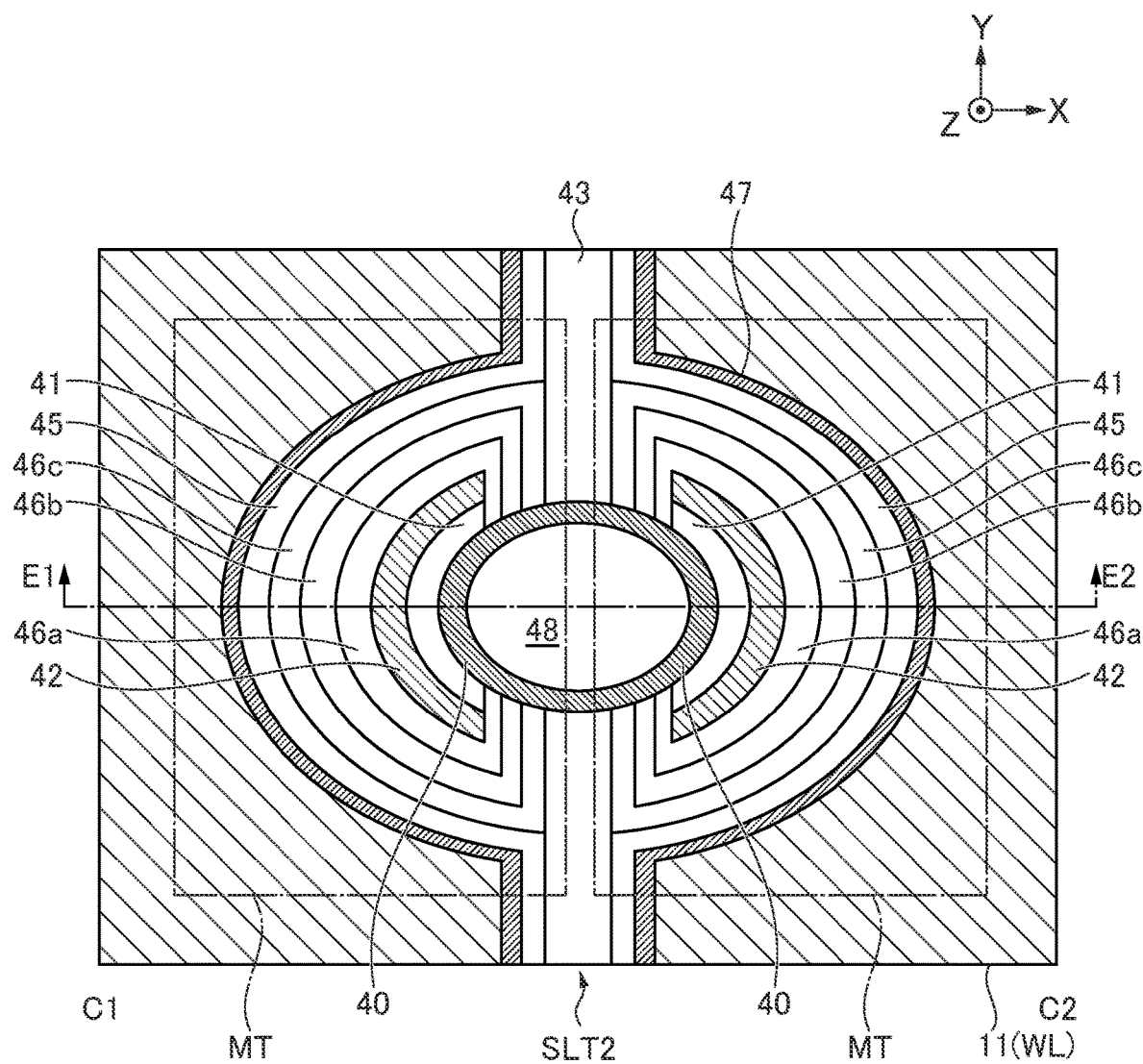
FIG. 9 is a cross-sectional view of a cut portion showing a modification example of the memory cell transistor shown in FIG. 7.
Figure 10:
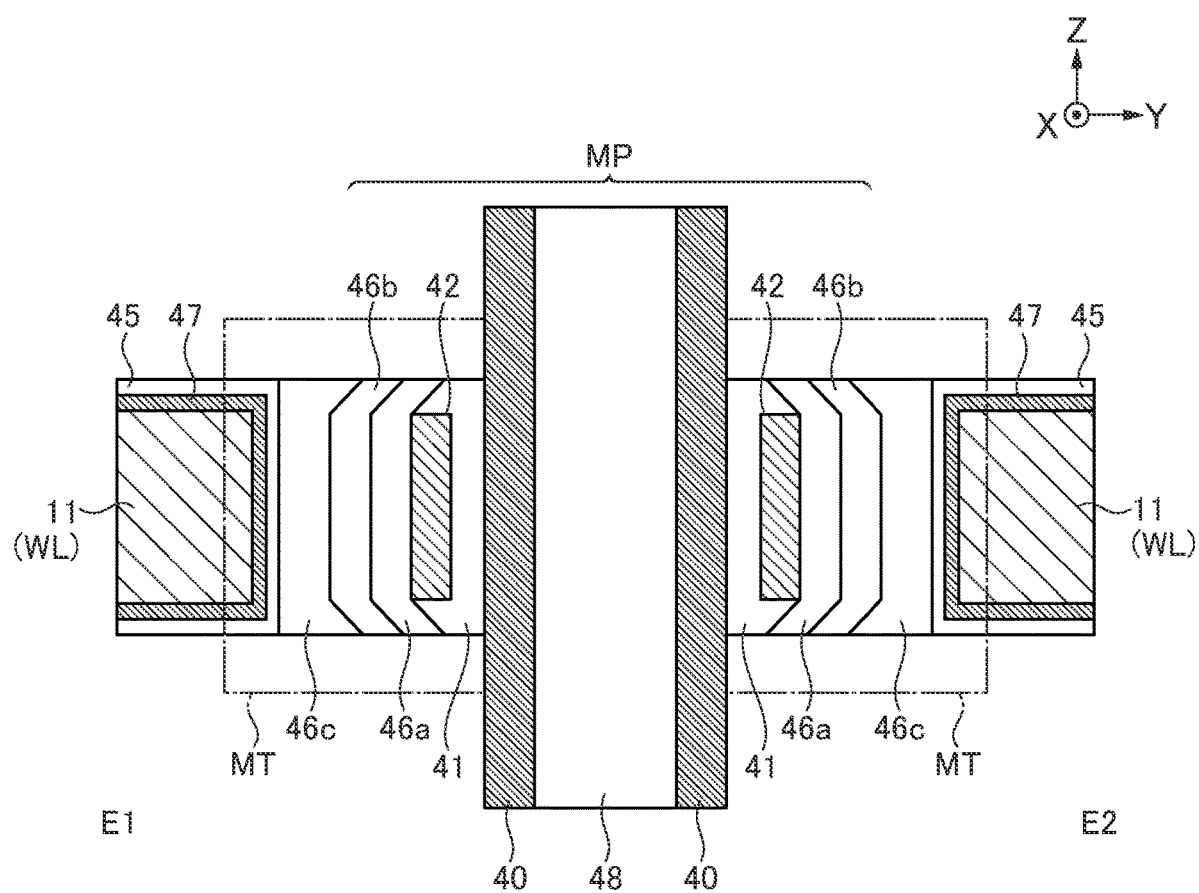
FIG. 10 is a cross-sectional view of an E1-E2 cut portion of the memory cell transistor shown in FIG. 9.
Figure 11:
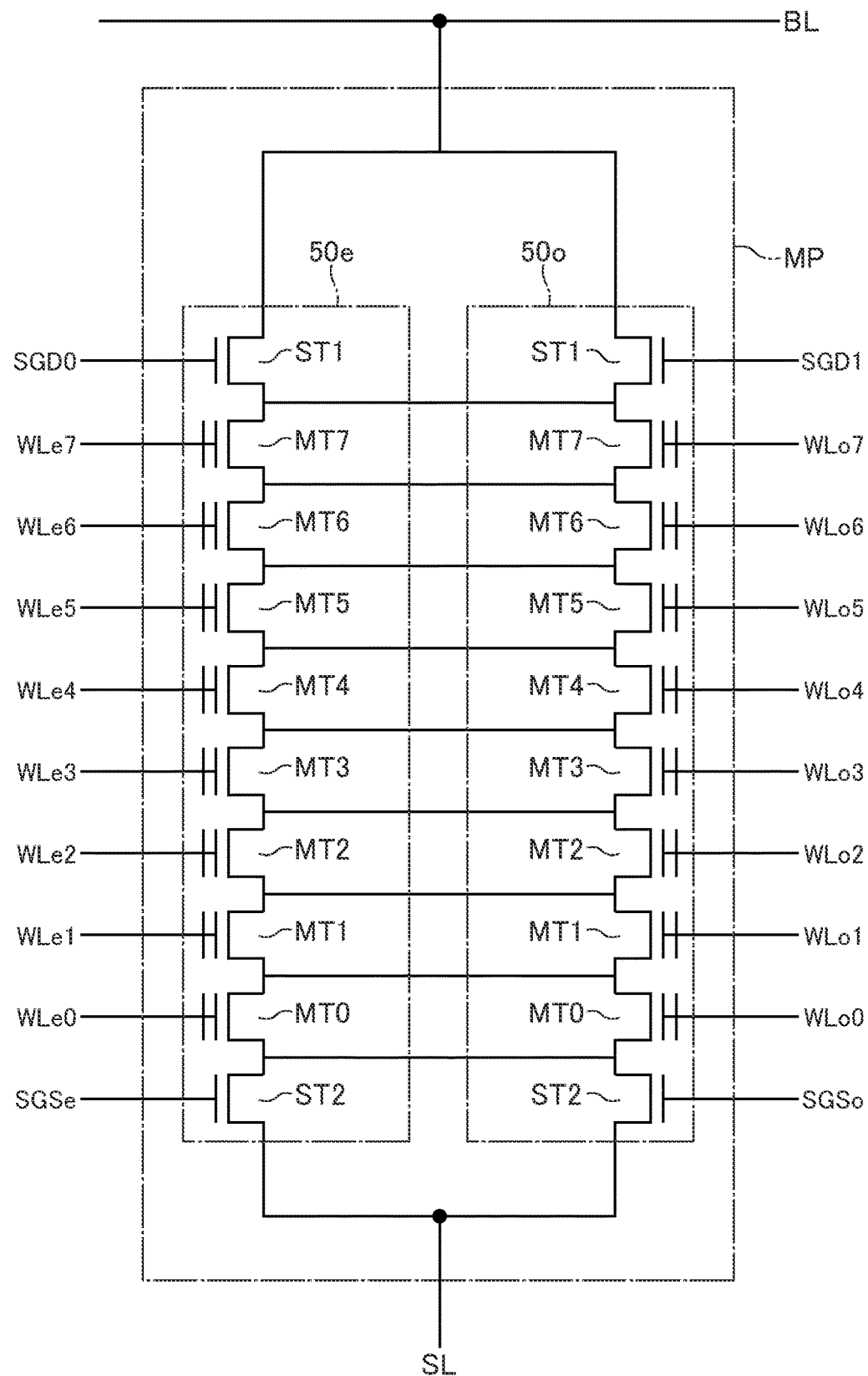
FIG. 11 is a diagram showing an equivalent circuit of a memory pillar (two NAND strings adjacent to each other) in the semiconductor memory device according to the first embodiment.

FIG. 9 is a diagram showing a modification example of the memory cell transistor shown in FIG. 7, and is a cross-sectional view of a C1-C2 cut portion of the memory cell transistor shown in FIG. 5. FIG. 10 is a cross-sectional view of an E1-E2 cut portion of the memory cell transistor shown in FIG. 9. FIGS. 9 and 10 are cross-sectional views of cut portions, each of which shows a region including two memory cell transistors MT. In the second example, the charge storage layer included in the memory cell transistor MT is a conductive film. The second example of the memory cell transistor according to the embodiment is not limited to the structures shown in FIGS. 10 and 11. In the description of FIGS. 10 and 11, the description of the same or similar configuration as that of FIGS. 1 to 9 may be omitted.

As shown in FIGS. 10 and 11, the memory pillar MP includes an insulating layer 48 and an insulating layer 43, a semiconductor layer 40, an insulating layer 41, a conductive layer 42, and insulating layers 46a to 46c, all of which are provided along the Z direction. The insulating layer 48 is formed by using, for example, a silicon oxide film. The semiconductor layer 40 is provided so as to surround the insulating layer 48. The semiconductor layer 40 functions as a region where a channel of the memory cell transistor MT is formed. The semiconductor layer 40 is formed by using, for example, a polycrystalline silicon layer. As in the first example of the memory pillar MP shown in FIG. 8, the semiconductor layer 40 is not separated between the memory cell transistors MT in the same memory pillar MP, but is provided continuously.

The insulating layer 41 is provided around the semiconductor layer 40 and functions as a gate insulating film of each memory cell transistor MT. The insulating layer 41 is separated into two regions within the XY plane shown in FIG. 10. Each of the insulating layers 41 obtained as a result of separation into two regions functions as a gate insulating film of each of the two memory cell transistors MT in the same memory pillar MP. The insulating layer 41 is formed by using, for example, a stacked structure of a silicon oxide film and a silicon nitride film.

The conductive layer 42 is provided around the insulating layer 41 and is separated into two regions along the Y direction by the insulating layer 43. Each of the conductive layers 42 obtained as a result of separation into two regions functions as a charge storage layer of each of the two memory cell transistors MT. The conductive layer 42 is formed by using, for example, a polycrystalline silicon layer.

The insulating layer 43 is formed by using, for example, a silicon oxide film. Around the conductive layer 42, the insulating layers 46a, 46b, and 46c are provided sequentially from the side close to the conductive layer 42. The insulating layers 46a and 46c are formed by using, for example, a silicon oxide film, and the insulating layer 46b is formed by using, for example, a silicon nitride film. Each of the insulating layers 46a, 46b, and 46c functions as a block insulating film of the memory cell transistor MT. Each of the insulating layers 46a, 46b, and 46c is separated into two regions along the Y direction. The insulating layer 43 is provided between the insulating layers 46c obtained as a result of separation into two regions. In addition, the insulating layer 43 is embedded in the slit SLT2. The insulating layer 43 is formed by using, for example, a silicon oxide film.

In the second example of the present embodiment, for example, an AlO layer 45 is provided around the memory pillar MP. For example, a barrier metal layer 47 is provided around the AlO layer 45. The barrier metal layer 47 is formed by using, for example, a TiN film. The wiring layer 11 that functions as the word line WL is provided around the barrier metal layer 47. As in the first example of the memory pillar MP according to the present embodiment, the wiring layer 11 in the second example of the memory pillar MP according to the present embodiment is formed by using, for example, a film formed of tungsten.

Also in the second example of the memory pillar MP according to the present embodiment, as in the first example of the memory pillar MP, one memory pillar MP includes two memory cell transistors MT and MT or two selection transistor ST1 and ST2 along the Y direction at a predetermined position on the Z axis. In addition, although not shown, an insulating layer is provided between the memory cell transistors adjacent to each other in the Z direction. By the insulating layer, the insulating layer 43, and the insulating layer 46, the conductive layer 42 is insulated for each individual memory cell transistor.

FIG. 11 is an equivalent circuit diagram of a memory pillar (two NAND strings adjacent to each other) in the semiconductor memory device 1 according to the present embodiment. The equivalent circuit diagram of the memory pillar according to the present embodiment is not limited to the equivalent circuit diagram shown in FIG. 11. In the description of FIG. 11, the description of the same or similar configuration as that of FIGS. 1 to 10 may be omitted.

As shown in FIG. 11, two NAND strings 50e and 50o are formed in one memory pillar MP. Each of the NAND strings 50e and 50o has the selection transistor ST1, the memory cell transistors MT0 to MT7, and the selection transistor ST2 electrically connected in series to each other. The NAND string 50e and the NAND string 50o are provided so as to face each other. Therefore, the selection transistor ST1, the memory cell transistors MT0 to MT7, and the selection transistor ST2 included in the NAND string 50e and the selection transistor ST1, the memory cell transistors MT0 to MT7, and the selection transistor ST2 included in the NAND string 50o are provided so as to face each other on a one-to-one basis. Specifically, the selection transistor ST1 included in the NAND string 50e and the selection transistor ST1 included in the NAND string 50o are provided so as to face each other, the memory cell transistors MT0 to MT7 included in the NAND string 50e and the memory cell transistors MT0 to MT7 included in the NAND string 50o are provided so as to face each other on a one-to-one basis, and the selection transistor ST2 included in the NAND string 50e and the selection transistor ST2 included in the NAND string 50o are provided so as to face each other.

In the following description, an example including two memory pillars MP, that is, a first memory pillar MP (for example, MP4 in FIG. 4) and a second memory pillar MP (for example, MP0 in FIG. 4) adjacent to the first memory pillar MP will be mainly described.

The selection transistor ST1 of the NAND string 50e provided in each of the first memory pillar MP and the second memory pillar MP is connected to, for example, the common select gate line SGD0. The selection transistor ST1 of the NAND string 50o provided in each of the first memory pillar MP and the second memory pillar MP is connected to, for example, the common select gate line SGD1. The memory cell transistors MT0 to MT7 of the NAND string 50e provided in each of the first memory pillar MP and the second memory pillar MP are connected to the common word lines WLe0 to WLe7, respectively. The memory cell transistors MT0 to MT7 of the NAND string 50o provided in each of the first memory pillar MP and the second memory pillar MP are connected to the common word lines WLo0 to WLo7, respectively. The selection transistor ST2 of the NAND string 50e provided in each of the first memory pillar MP and the second memory pillar MP is connected to, for example, the common even-numbered select gate line SGSe. The selection transistor ST2 of the NAND string 50o provided in each of the first memory pillar MP and the second memory pillar MP is connected to, for example, the common odd-numbered select gate line SGSo.

As described above, the selection transistor ST1, the memory cell transistors MT0 to MT7, and the selection transistor ST2 included in the NAND string 50e correspond to the selection transistor ST1, the memory cell transistors MT0 to MT7, and the selection transistor ST2 included in the NAND string 50o, respectively. In the two transistors facing each other, the sources are electrically connected to each other and the drains are electrically connected to each other. Specifically, in the NAND strings 50e and 50o, the sources of the selection transistors ST1 facing each other are electrically connected to each other and the drains of the selection transistors ST1 facing each other are electrically connected to each other, the sources of the memory cell transistors MT0 to MT7 facing each other are electrically connected to each other and the drains of the memory cell transistors MT0 to MT7 facing each other are electrically connected to each other, and the sources of the selection transistors ST2 facing each other are electrically connected to each other and the drains of the selection transistors ST2 facing each other are electrically connected to each other. This is because the channels formed in the transistors facing each other share a part of the memory pillar MP.

The two NAND strings 50e and 50o in the same memory pillar MP are connected to the same bit line BL and the same source line SL.

How the select gate line SGD is selected will be described with reference to FIGS. 3 and 4. When one of the select gate lines SGD0 to SGD3 is selected, a voltage for turning on the selection transistor ST1 is supplied to one of the wiring layers 10-0 to 10-3 corresponding to each select gate line. For example, when the wiring layer 10-1 is selected, eight selection transistors ST1 provided in the memory pillars MP0, MP1, MP4, MP5, MP8, MP9, MP12, and MP13 are turned on. As a result, eight memory cell transistors MT belonging to the above memory pillars are selected. That is, one page is formed by the above eight memory cell transistors MT. Since the operation when a wiring layer other than the wiring layer 10-1 is selected is the same as the above, the description will be omitted.

In the present embodiment, for example, the TLC method is applied as a writing method of the memory cell transistor MT. A plurality of memory cell transistors MT to which the TLC method is applied form eight threshold distributions (write levels). The eight threshold distributions are referred to as, for example, "Er" level, "A" level, "B" level, "C" level, "D" level, "E" level, "F" level, and "G" level in order from the lowest threshold voltage. Different 3-bit data is assigned to "Er" level, "A" level, "B" level, "C" level, "D" level, "E" level, "F" level, and "G" level.

The semiconductor memory device 1 according to the present embodiment repeatedly executes a program loop in the write operation. The program loop includes, for example, a program operation and a verify operation. The program operation is an operation of increasing the threshold voltage of the selected memory cell transistor MT by injecting electrons into the charge storage layer in the selected memory cell transistor MT. Alternatively, the program operation is an operation of maintaining the threshold voltage of the selected memory cell transistor MT by prohibiting the injection of electrons into the charge storage layer. The verify operation is an operation of checking whether or not the threshold voltage of the selected memory cell transistor MT has reached the target level by a read operation using the verify voltage subsequent to the program operation. The selected memory cell transistor MT whose threshold voltage has reached the target level is then write-protected.

In the semiconductor memory device 1 according to the present embodiment, the threshold voltage of the selected memory cell transistor MT is increased to the target level by repeatedly executing the program loop including the program operation and the verify operation described above.

The electrons stored in the charge storage layer may be stored in an unstable state. Therefore, from the time when the above-described program operation is completed, the electrons stored in the charge storage layer of the memory cell transistor MT may escape from the charge storage layer with the passage of time. When the electrons escape from the charge storage layer, the threshold voltage of the memory cell transistor MT decreases. Therefore, in the read operation executed after the write operation is completed, in order to cope with such a decrease in the threshold voltage of the memory cell transistor that may occur with the passage of time, the read operation is performed using a read voltage lower than the verify voltage. The read operation may include a verify operation.

Figure 13:
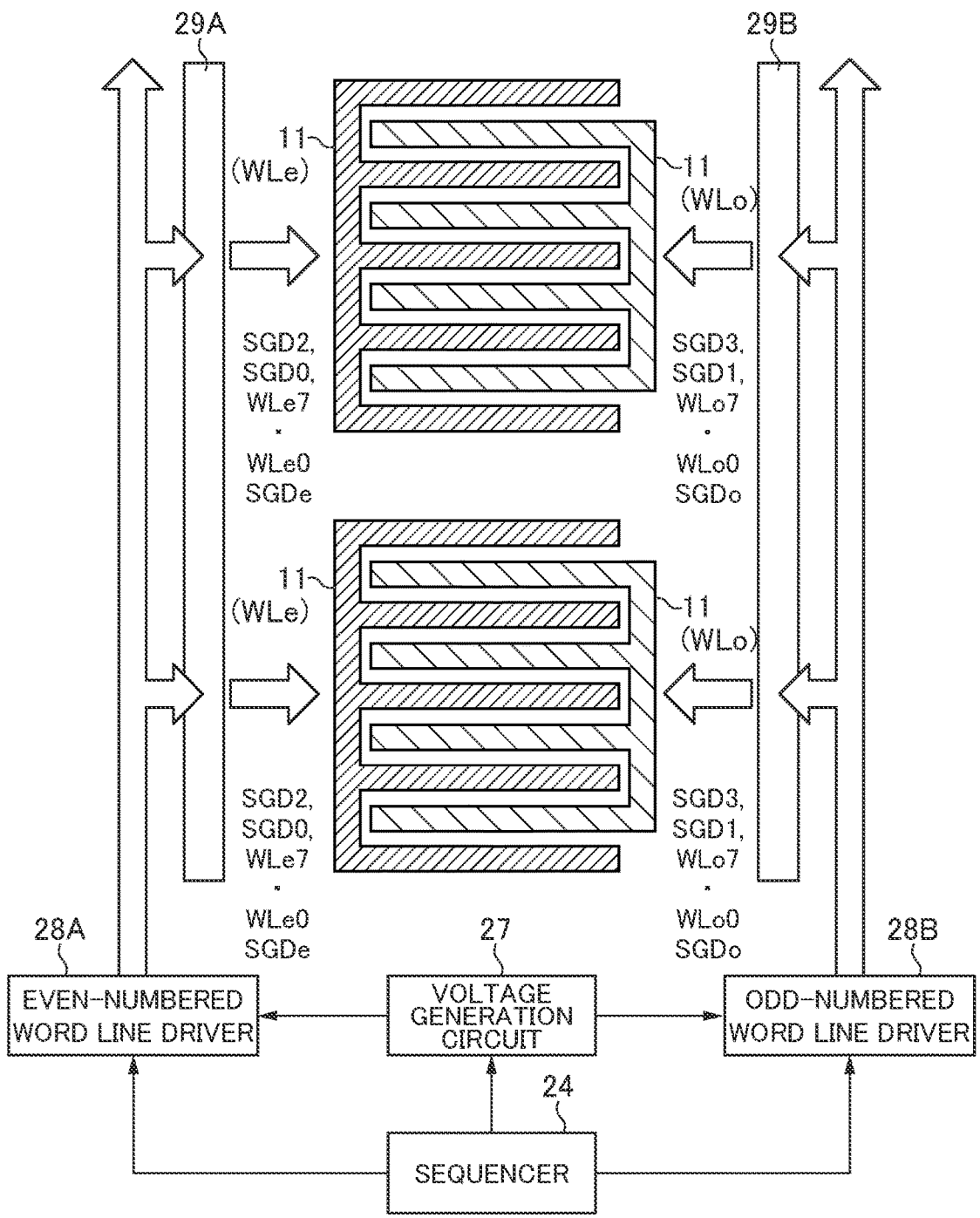
FIG. 13 is a diagram for describing the electrical connection of a voltage generation circuit, a driver set, a select gate line, and a word line according to the first embodiment.

FIGS. 12 and 13 are diagrams for describing the electrical connection of the sequencer 24, the voltage generation circuit 27, the driver set 28, the row decoder 29, the select gate line SGD or the word line WL according to the present embodiment. The electrical connection of the sequencer 24, the voltage generation circuit 27, the driver set 28, the row decoder 29, the select gate line SGD or the word line WL according to the present embodiment is not limited to the electrical connections shown in FIG. 12. In the description of FIGS. 12 and 13, the description of the same or similar configuration as that of FIGS. 1 to 11 may be omitted. A circuit including the sequencer 24, the voltage generation circuit 27, the driver set 28, and the row decoder 29 is an example of a control circuit.

As shown in FIG. 12, the wiring layer 11 that functions as the even-numbered word line WLe may be connected to the even-numbered word line driver 28A, and the wiring layer 11 that functions as the odd-numbered word line WLo may be electrically connected to the odd-numbered word line driver 28B. As described above, the even-numbered word line driver 28A and the odd-numbered word line driver 28B are included in the driver set 28. The driver set 28 is electrically connected to the voltage generation circuit 27. As shown in FIGS. 12 and 13, the even-numbered word line driver 28A and the odd-numbered word line driver 28B may generate various voltages using the voltage supplied from the voltage generation circuit 27. Then, the even-numbered word line driver 28A may supply the generated voltage to the even-numbered word line WLe of each block BLK through the row decoder 29A. In addition, the odd-numbered word line driver 28B may supply the generated voltage to the odd-numbered word line WLo of each block BLK through the row decoder 29B. The row decoder 29A and the row decoder 29B are included in the row decoder 29.

As shown in FIG. 13 and as described above, the sequencer 24 can execute various operations, such as a write operation and a read operation, by controlling the driver set 28 and the like.

Figure 14:
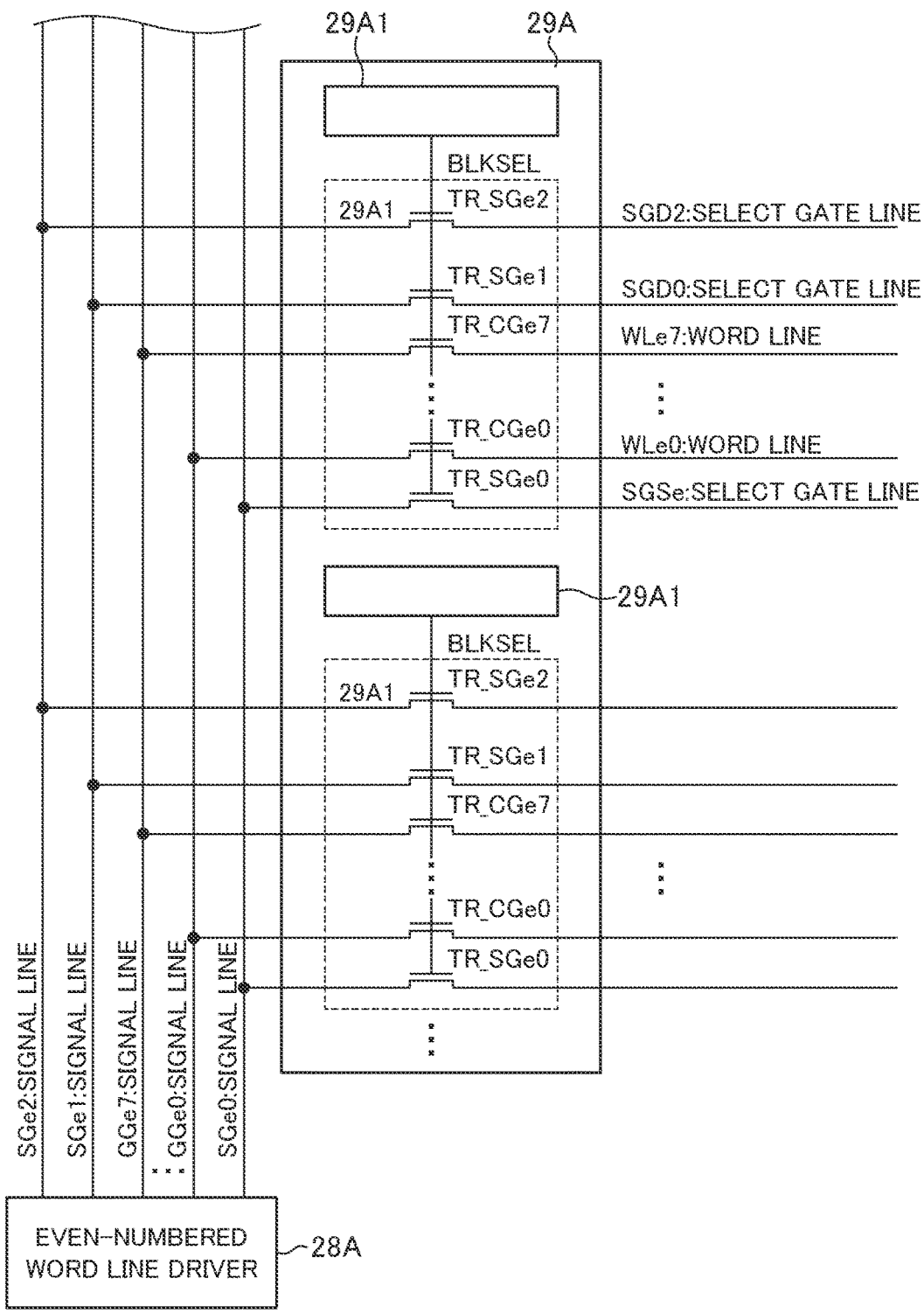
FIG. 14 is a schematic diagram for describing the electrical connection between an even-numbered word line driver and a row decoder according to the first embodiment.

FIG. 14 is a schematic diagram for describing the electrical connection between the even-numbered word line driver 28A and the row decoder 29A according to the present embodiment.

A signal line SGe0, a signal line SGe1, a signal line SGe2, and signal lines CGe0, . . . , CGe7 as signal lines CGe are connected to the even-numbered word line driver 28A. In addition, as for the signal line CGe, for example, as many signal lines CGe as the number of even-numbered word lines WL disposed in the Z direction in the block BLK are connected.

The signal line SGe0 is connected to the even-numbered select gate line SGSe in each block BLK through a transistor TR_SGe0. The transistor TR_SGe0 functions as a switch for turning on/off the signal from the signal line SGe0 using a block decoder 29A1.

The signal lines CGe0, . . . , CGe7 are connected to the even-numbered word lines WLe0, . . . , WLe7 in each block BLK through transistors TR_CGe0, . . . , TRCGe7, respectively. The transistors TR_CGe0, . . . , TRCGe7 function as switches for turning on/off the signals from the signal lines CGe0, . . . , CGe7 using the block decoder 29A1.

The signal line SGe1 is connected to the select gate line SGD0 in each block BLK through a transistor TR_SGe1. The transistor TR_SGe1 functions as a switch for turning on/off the signal from the signal line SGe1 using the block decoder 29A1.

The signal line SGe2 is connected to the select gate line SGD2 in each block BLK through a transistor TR_SGe2. The transistor TR_SGe2 functions as a switch for turning on/off the signal from the signal line SGe2 using the block decoder 29A1.

Figure 15:
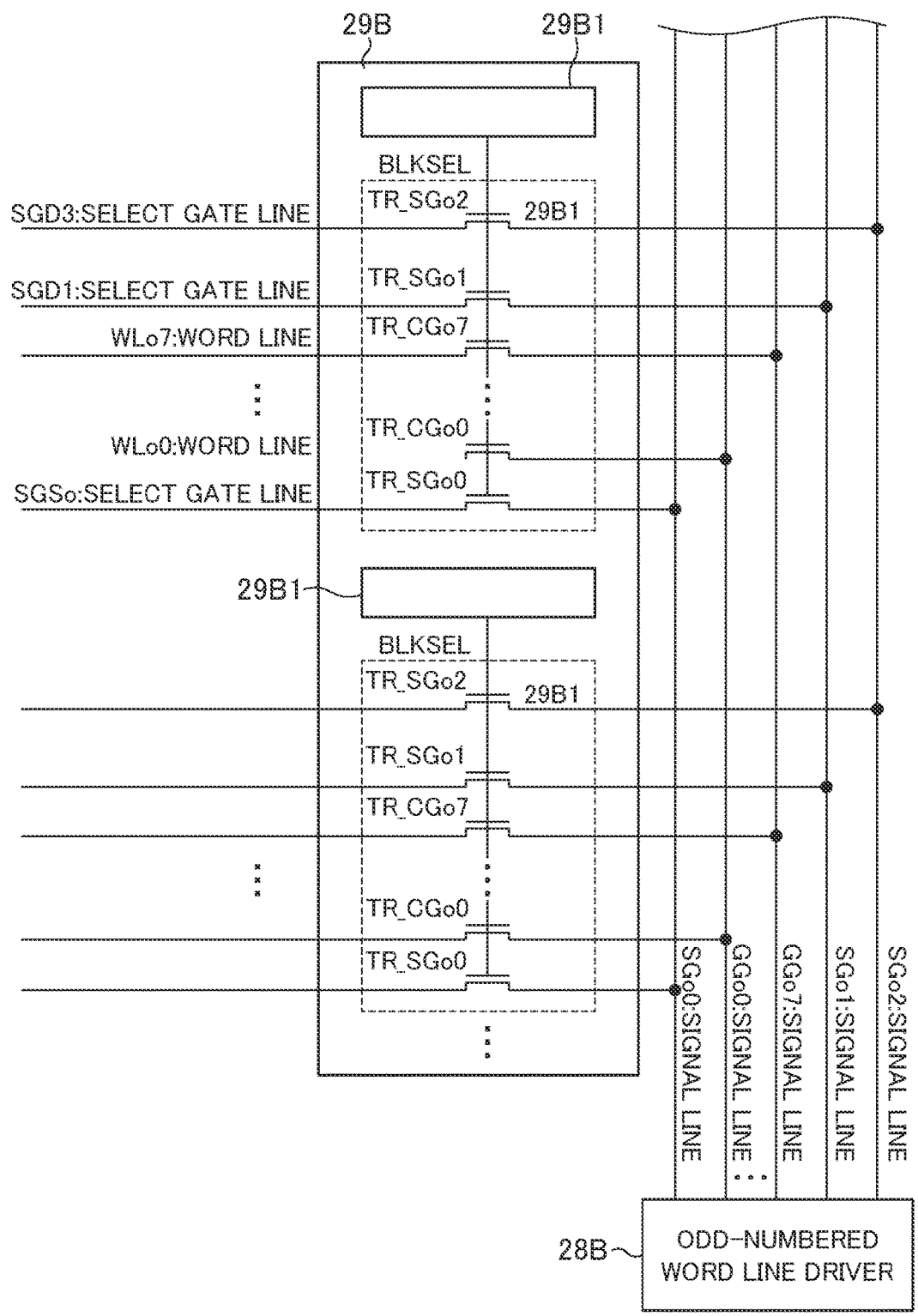
FIG. 15 is a schematic diagram for describing the electrical connection between an odd-numbered word line driver and a row decoder according to the first embodiment.

FIG. 15 is a schematic diagram for describing the electrical connection between the odd-numbered word line driver 28B and the row decoder 29B according to the present embodiment.

A signal line SGo0, a signal line SGo1, a signal line SGo2, and signal lines CGo0, . . . , CGo7 as signal lines CGo are connected to the odd-numbered word line driver 28B. In addition, as for the signal line CGo, for example, as many signal lines CGo as the number of odd-numbered word lines WL disposed in the Z direction in the block BLK are connected.

The signal line SGo0 is connected to the odd-numbered select gate line SGSo in each block BLK through a transistor TR_SGo0. The transistor TR_SGo0 functions as a switch for turning on/off the signal from the signal line SGo0 using a block decoder 29B1.

The signal lines CGo0, . . . , CGo7 are connected to the odd-numbered word lines WLo0, . . . , WLo7 in each block BLK through transistors TR_CGo0, . . . , TRCGo7, respectively. The transistors TR_CGo0, . . . , TRCGo7 functions as switches for turning on/off the signals from the signal lines CGo0, . . . , CGo7 using the block decoder 29B1.

The signal line SGo1 is connected to the select gate line SGD1 in each block BLK through a transistor TR_SGo1. The transistor TR_SGo1 functions as a switch for turning on/off the signal from the signal line SGo1 by the block decoder 29B1.

The signal line SGo2 is connected to the select gate line SGD3 in each block BLK through a transistor TR_SGo2. The transistor TR_SGo2 functions as a switch for turning on/off the signal from the signal line SGo2 using the block decoder 29B1.

Figure 16:
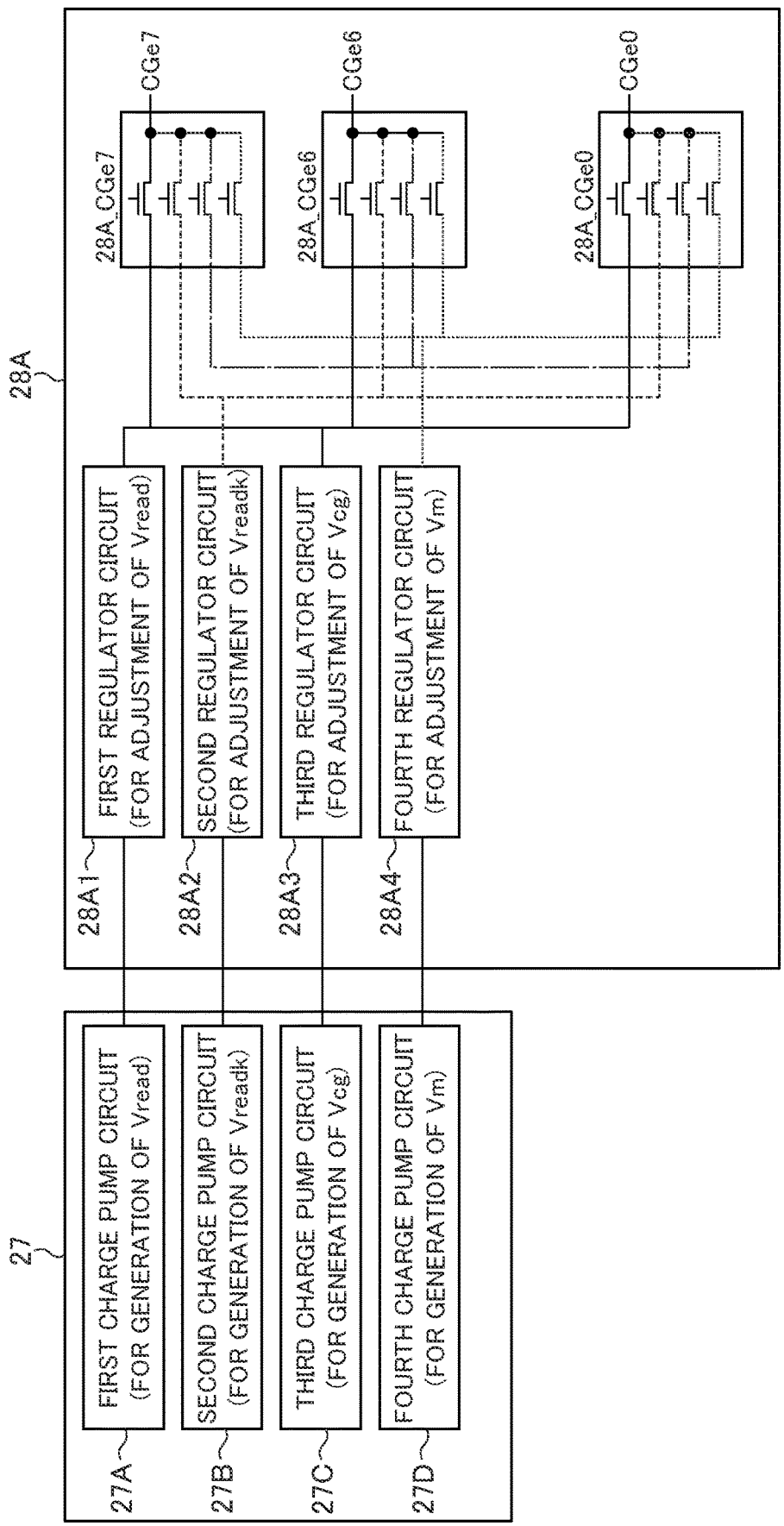
FIG. 16 is a schematic diagram for describing the electrical connection between a voltage generation circuit and an even-numbered word line driver according to the first embodiment.

FIG. 16 is a schematic diagram for describing the electrical connection between the voltage generation circuit 27 and the even-numbered word line driver 28A according to the present embodiment.

Voltages Vread, VreadK, Vcg, and Vm, which will be described later, are generated by, for example, a first charge pump circuit 27A, a second charge pump circuit 27B, a third charge pump circuit 27C, and a fourth charge pump circuit 27D in the voltage generation circuit 27, respectively. Then, the voltages Vread, VreadK, Vcg, and Vm are held by a first regulator circuit 28A1, a second regulator circuit 28A2, a third regulator circuit 28A3, and a fourth regulator circuit 28A4 in the even-numbered word line driver 28A, respectively. After that, the voltages Vread, VreadK, Vcg, and Vm are appropriately added and supplied to the signal lines CGe0, . . . , CGe7.

Figure 17:
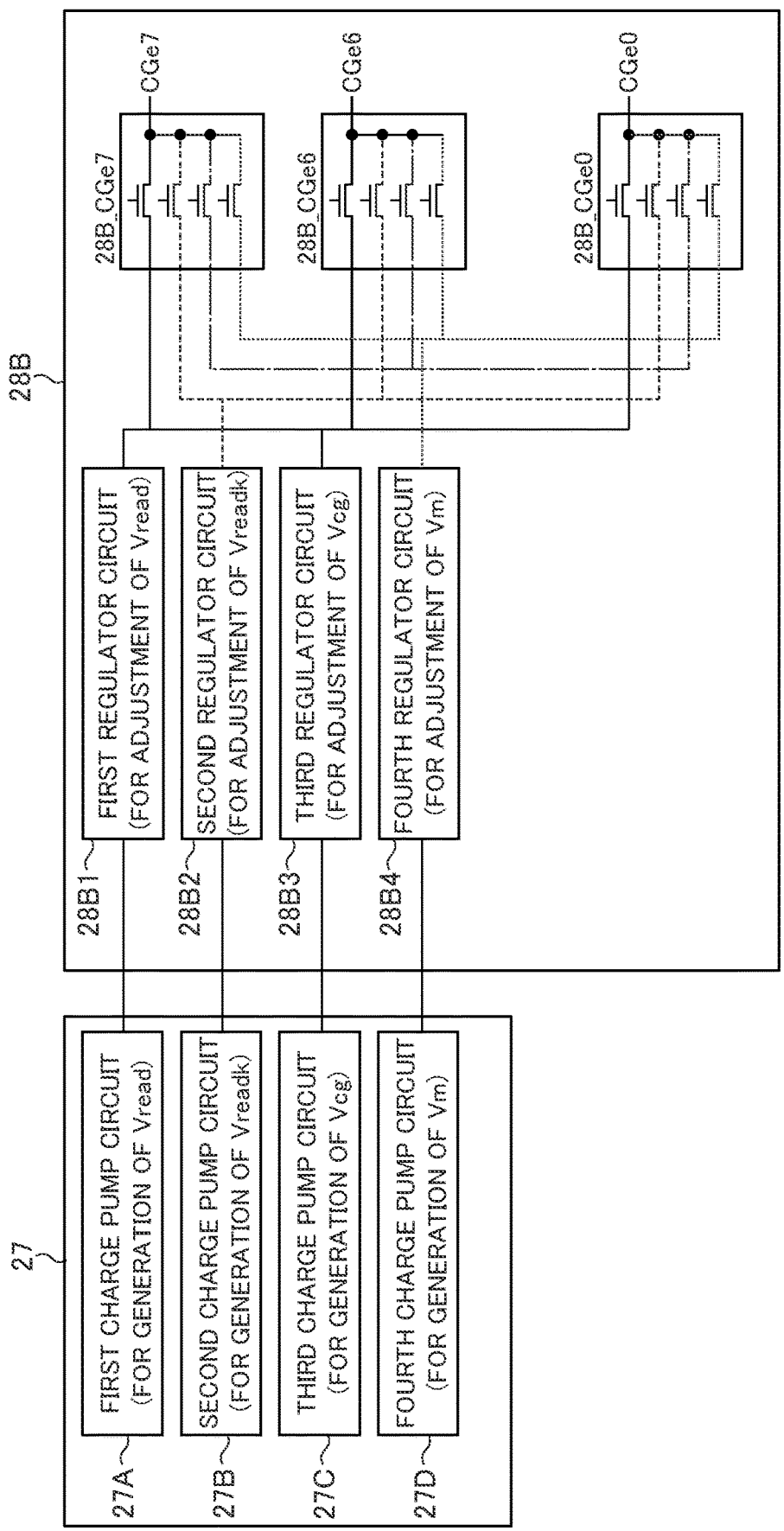
FIG. 17 is a schematic diagram for describing the electrical connection between a voltage generation circuit and an odd-numbered word line driver according to the first embodiment.

FIG. 17 is a schematic diagram for describing the electrical connection between the voltage generation circuit 27 and the odd-numbered word line driver 28B according to the present embodiment.

The voltages Vread, VreadK, Vcg, and Vm are held by a first regulator circuit 28B1, a second regulator circuit 28B2, a third regulator circuit 28B3, and a fourth regulator circuit 28B4 in the odd-numbered word line driver 28B, respectively. After that, the voltages Vread, VreadK, Vcg, and Vm are appropriately added and supplied to the signal lines CGe0, . . . , CGe7.

First Embodiment

Figure 18:
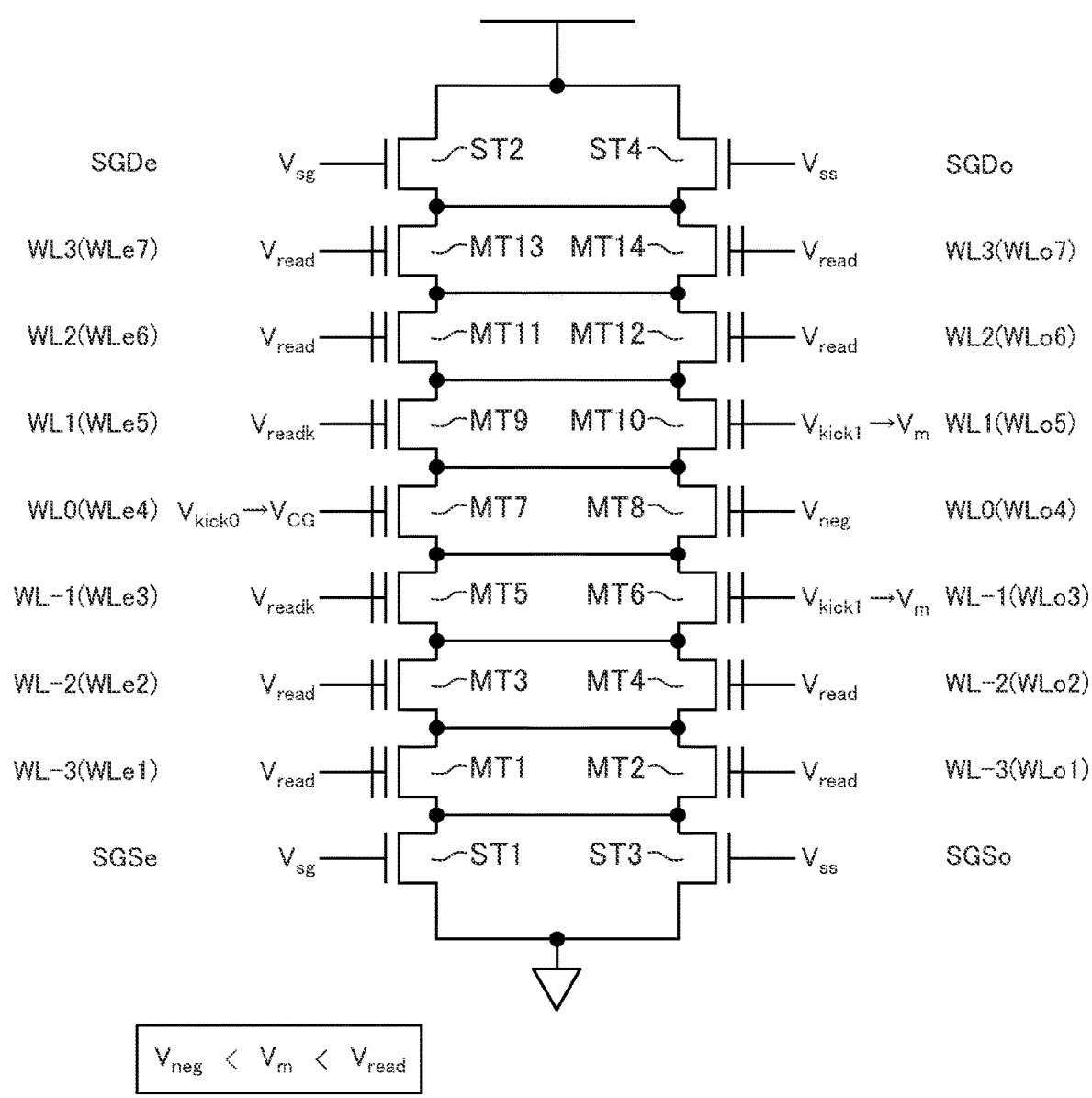
FIG. 18 is a diagram schematically showing an equivalent circuit of a memory pillar (two NAND strings adjacent to each other) and a voltage applied to each memory cell transistor through a word line in the semiconductor memory device of the first embodiment.
Figure 19A:
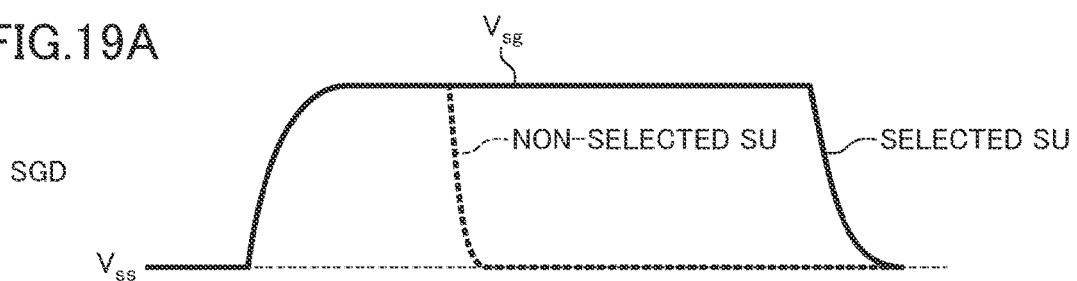
FIGS. 19A to 19C are diagrams schematically showing the timing charts of various signals at the time of data read operation in the semiconductor memory device of the first embodiment.
Figure 19B:
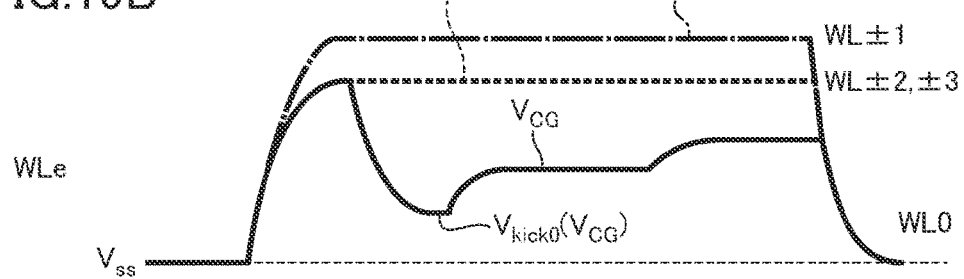
Figure 19C:
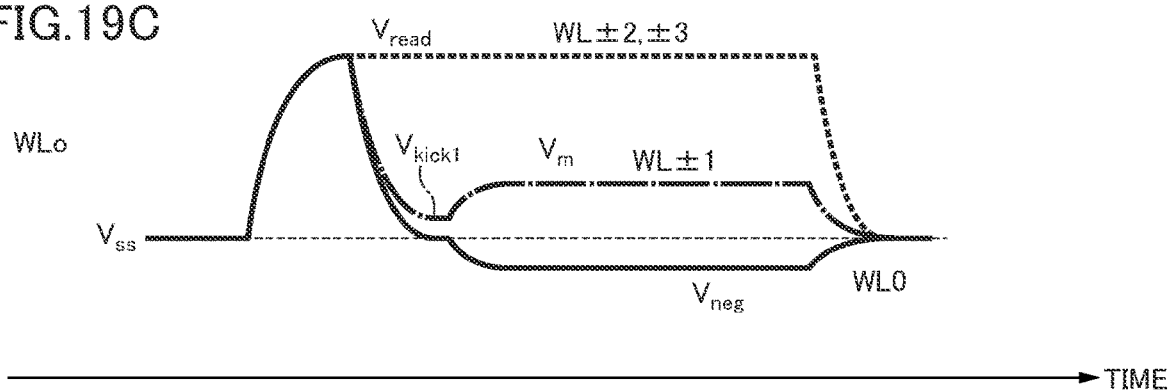
Figure 20:
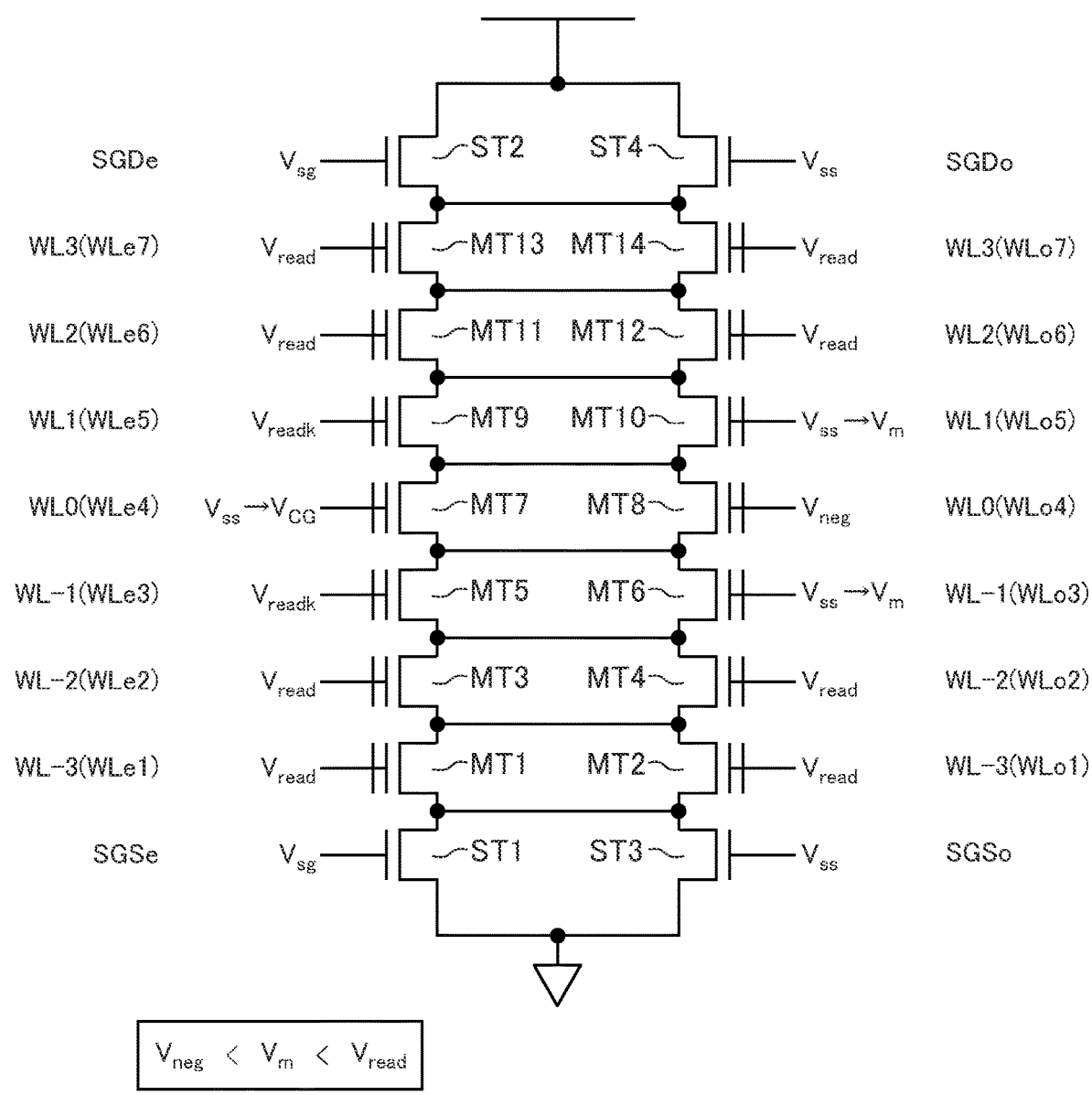
FIG. 20 is a diagram schematically showing an equivalent circuit of a memory pillar (two NAND strings adjacent to each other) and a voltage applied to each memory cell transistor through a word line in a semiconductor memory device of a comparative form.
Figure 21A:
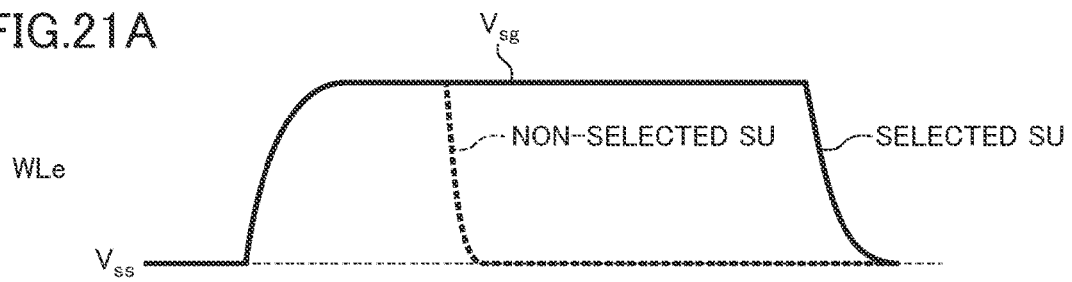
FIGS. 21A to 21C are diagrams schematically showing the timing charts of various signals at the time of data read operation in the semiconductor memory device of the comparative form.
Figure 21B:
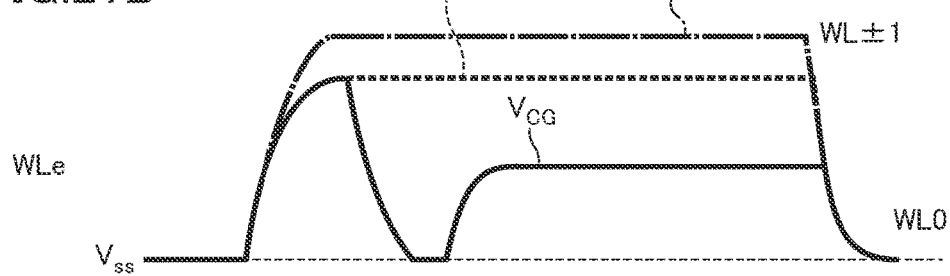
Figure 21C:
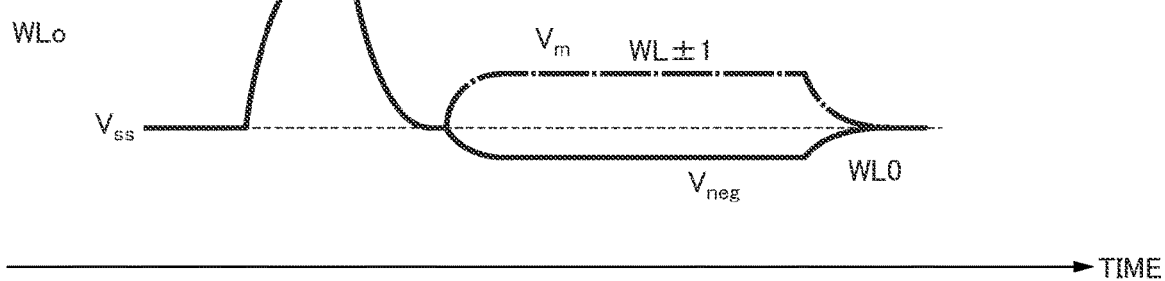

FIG. 18 is a diagram schematically showing an equivalent circuit of a memory pillar (two NAND strings adjacent to each other) and a voltage applied to each memory cell transistor through a word line in a semiconductor memory device of the present embodiment. FIGS. 19A to 19C are diagrams schematically showing the timing charts of various signals at the time of data read operation in the semiconductor memory device of the present embodiment.

An example of the read operation in the semiconductor memory device of the present embodiment will be described. In addition, in the following description, it is assumed that the memory cell transistor MT having a control gate connected to the word line WLe1 (an example of a first conductive layer) is MT1 (an example of a first memory cell that stores first information), the memory cell transistor MT having a control gate connected to the word line WLe2 (an example of a third conductive layer) is MT3 (an example of a third memory cell that stores third information), the memory cell transistor MT having a control gate connected to the word line WLe3 (an example of a fifth conductive layer) is MI5 (an example of a fifth memory cell that stores fifth information), the memory cell transistor MT having a control gate connected to the word line WLe4 (an example of a seventh conductive layer) is MT7 (an example of a seventh memory cell that stores seventh information), the memory cell transistor MT having a control gate connected to the word line WLe5 (an example of a ninth conductive layer) is MT9 (an example of a ninth memory cell that stores ninth information), the memory cell transistor MT having a control gate connected to the word line WLe6 (an example of an eleventh conductive layer) is MT11 (an example of an eleventh memory cell that stores eleventh information), the memory cell transistor MT having a control gate connected to the word line WLe7 (an example of a thirteenth conductive layer) is MT13 (an example of a thirteenth memory cell that stores thirteenth information), the memory cell transistor MT having a control gate connected to the word line WLo1 (an example of a second conductive layer) is MT2 (an example of a second memory cell that stores second information), the memory cell transistor MT having a control gate connected to the word line WLo2 (an example of a fourth conductive layer) is MT4 (an example of a fourth memory cell that stores fourth information), the memory cell transistor MT having a control gate connected to the word line WLo3 (an example of a sixth conductive layer) is MT6 (an example of a sixth memory cell that stores sixth information), the memory cell transistor MT having a control gate connected to the word line WLo4 (an example of an eighth conductive layer) is MT8 (an example of an eighth memory cell that stores eighth information), the memory cell transistor MT having a control gate connected to the word line WLo5 (an example of a tenth conductive layer) is MT10 (an example of a tenth memory cell that stores tenth information), the memory cell transistor MT having a control gate connected to the word line WLo6 (an example of a twelfth conductive layer) is MT12 (an example of a twelfth memory cell that stores twelfth information), and the memory cell transistor MT having a control gate connected to the word line WLo7 (an example of a fourteenth conductive layer) is MT14 (an example of a fourteenth memory cell that stores fourteenth information). In addition, it is assumed that the selection transistor ST having a gate connected to the select gate line SGSe is ST1. It is assumed that the selection transistor ST having a gate connected to the select gate line SGDe is ST2. It is assumed that the selection transistor ST having a gate connected to the select gate line SGSo is ST3. It is assumed that the selection transistor ST having a gate connected to the select gate line SGDo is ST4.

FIG. 19A is a diagram schematically showing a voltage applied to the select gate line SGDe and the select gate line SGDo. FIG. 19B is a diagram schematically showing a voltage applied to the control gates of the memory cell transistors MT1, MT3, MT5, MT7, MT9, MT11, and MT13. FIG. 19C is a diagram schematically showing a voltage applied to the control gates of the memory cell transistors MT2, MT4, MT6, MT8, MT10, MT12, and MT14.

Hereinafter, an example of the read operation of the memory cell transistor MT7 will be shown. In addition, Vread is an example of the first voltage, VreadK is an example of the second voltage, Vkick0 is an example of the third voltage, Vkick1 is an example of the fourth voltage, Vss is an example of the fifth voltage, Vcg is an example of the sixth voltage, Vm is an example of the seventh voltage, and Vneg is an example of the eighth voltage.

Hereinafter, the read operation of the memory cell transistor MT7 will be described assuming that, for example, a first operation, a second operation, and a third operation are performed. Here, it is assumed that the second operation is performed after the first operation and the third operation is performed after the second operation.

First, the first operation will be described. A voltage Vsg is applied to the select gate line SGSe and the select gate line SGDe. In addition, the voltage Vsg is applied to the select gate line SGSo and the select gate line SGDo. The voltage Vsg is a voltage that turns on the selection transistors ST1, ST2, ST3, and ST4. The NAND string including the memory cell transistors MT1, MT3, MT5, MT7, MT9, MT11, and MT13 is a selected NAND string (selected SU). The NAND string including the memory cell transistors MT2, MT4, MT6, MT8, MT10, MT12, and MT14 is a non-selected NAND string (non-selected SU).

In addition, in the first operation, the voltage Vread is applied to the word line WLe1, the word line WLe2, the word line WLe4, the word line WLe6, the word line WLe7, the word line WLo1, the word line WLo2, the word line WLo3, the word line WLo4, the word line WLo5, the word line WLo6, and the word line WLo7. The voltage Vread is a voltage applied to the word line of the non-selected SU during the read operation, and is a voltage that turns on the memory cell transistor MT regardless of held data. The voltage Vread is, for example, 5 V, but is not limited to this.

In addition, in the first operation, a voltage Vreadk is applied to the word line WLe3 and the word line WLe5. Vreadk>Vread. The voltage Vreadk is a voltage applied to the non-selected word line adjacent to the memory cell transistor MT4 in which a read operation is performed. In addition, the voltage Vreadk may be equal to the voltage Vread.

Then, in the second operation, the voltage Vkick0 lower than the voltage Vread is applied to the word line WLe4. In addition, the voltage Vkick1 lower than the voltage Vread is applied to the word line WLo3 and the word line WLo5. In addition, the voltage Vss is applied to the word line WLo4. The voltage Vss is a ground potential. The voltage Vss is, for example, 0 V (zero volt). For example, Vkick0>Vss and Vkick1>Vss.

Then, in the third operation, the voltage Vcg higher than the voltage Vkick0 is applied to the word line WLe4. The voltage Vcg is a read voltage used for the read operation. In addition, the voltage Vm higher than the voltage Vkick1 and lower than the voltage Vread is applied to the word line WLo3 and the word line WLo5. In addition, the voltage Vneg lower than the voltage Vss is applied to the word line WLo4. Vneg<Vm<Vread. For example, the voltage Vm is 1 V and the voltage Vneg is −3 V, but the voltage Vm and the voltage Vneg are not limited to these. In the third operation, the voltage Vss is applied to the select gate line SGSo and the select gate line SGDo. In addition, the voltage Vm may be lower than the voltage Vkick1, for example. In other words, Vm<Vkick1<Vread may be satisfied.

In addition, as a fourth operation performed after the third operation, the voltage Vcg applied to the word line WLe4 may be increased.

Next, the function and effect of the semiconductor memory device of the present embodiment will be described.

As described above, a voltage is supplied to the word lines WL including the selected word line WL by using the sequencer 24, the voltage generation circuit 27, and the word line driver 28. Here, the word line WL itself has a resistance component R. In addition, an insulating material between the selected word line WL and the non-selected word line WL causes a coupling capacitance C. For this reason, there is a problem that it is difficult to apply the voltage to the word line WL at high speed due to the RC delay. In addition, the control gate of the memory cell transistor MT is connected to the distal end of the word line WL. For this reason, there is a problem that, as the influence of the RC delay becomes larger, it becomes more difficult to apply the voltage to the control gate at high speed.

Therefore, in order to apply the read voltage Vcg used for the read operation to the word line WLe4 while making a change from the voltage Vread at high speed, change to the voltage Vkick0 lower than the voltage Vcg is made first and then change to the voltage Vcg is made to apply the voltage Vcg. Here, the voltage Vkick0 is, for example, the voltage Vss that is a ground potential. However, if the voltage Vss is uniformly set as the voltage Vkick0, the voltage cannot be applied to the control gate of the memory cell transistor MT7 at sufficiently high speed in some cases.

Therefore, in the semiconductor memory device of the present embodiment, an arbitrary voltage that is not limited to the voltage Vss can be set as the voltage Vkick0. In this manner, it is possible to increase the speed of the read operation.

In addition, also for a voltage applied to the word line WLo3 and the word line WLo5, in order to apply the voltage while making a change from the voltage Vread to the voltage Vm, change to the voltage Vkick1 lower than the voltage Vm is made first and then change to the voltage Vm is made to apply the voltage Vm. Here, the voltage Vkick1 is, for example, the voltage Vss that is a ground potential. However, if the voltage Vss is uniformly set as the voltage Vkick1, the voltage cannot be applied to the control gate of the memory cell transistor MT6 and the control gate of the memory cell transistor MT10 at sufficiently high speed in some cases.

Therefore, in the semiconductor memory device of the present embodiment, the voltage Vkick1 applied to the word line WLo3 and the word line WLo5 can be controlled independently of the voltage Vkick0 applied to the word line WLe4. Since the voltage applied to the even-numbered word line WLe may be different from the voltage applied to the odd-numbered word line WLo, it is conceivable that the RC delay differs between the even-numbered word line WLe and the odd-numbered word line WLo. Therefore, by controlling the voltage Vkick0 and the voltage Vkick1 independently, it is possible to further increase the speed of the read operation.

Here, the voltage Vkick0 applied to the word line WLe4 is applied by using the third regulator circuit 28A3 shown in FIG. 16. In addition, the voltage Vkick1 applied to the word line WLo3 and the word line WLo5 is applied by using the fourth regulator circuit 28B4 shown in FIG. 17.

In other words, a control circuit includes a sequencer, the first regulator circuit 28A1 connected to the sequencer to apply the first voltage to the seventh conductive layer, the third regulator circuit 28A3 connected to the sequencer to apply the third voltage and the sixth voltage to the seventh conductive layer, the first regulator circuit 28B1 connected to the sequencer to apply the first voltage to the sixth conductive layer and the tenth conductive layer, and the fourth regulator circuit 28B4 connected to the sequencer to apply the fourth voltage and the seventh voltage to the sixth conductive layer and the tenth conductive layer.

According to the semiconductor memory device of the present embodiment, it is possible to provide a semiconductor memory device in which a read operation is speeded up.

Second Embodiment

Figure 22:
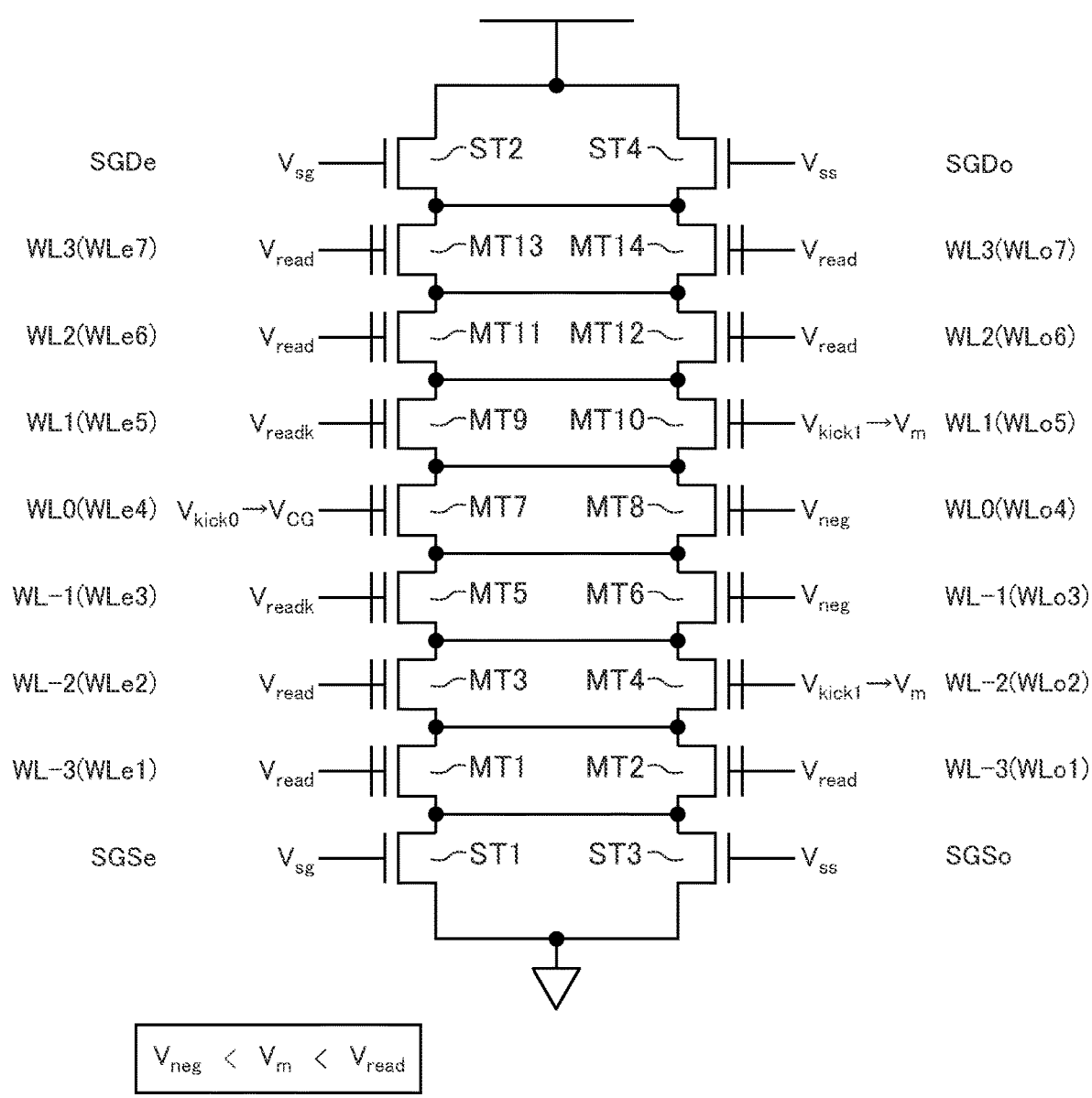
FIG. 22 is a diagram schematically showing an equivalent circuit of a memory pillar (two NAND strings adjacent to each other) and a voltage applied to each memory cell transistor through a word line in a semiconductor memory device of a second embodiment.
Figure 23A:
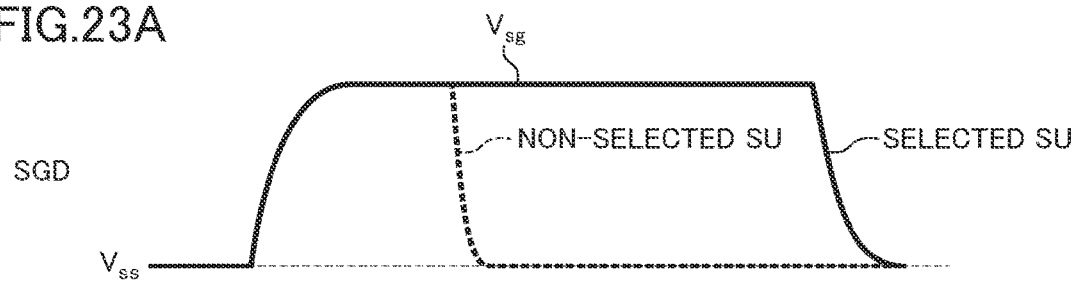
FIGS. 23A to 23C are diagrams schematically showing the timing charts of various signals at the time of data read operation in the semiconductor memory device of the second embodiment.
Figure 23B:
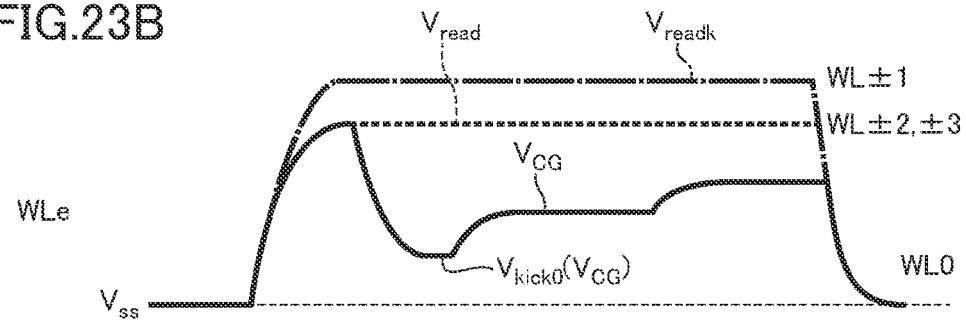
Figure 23C:
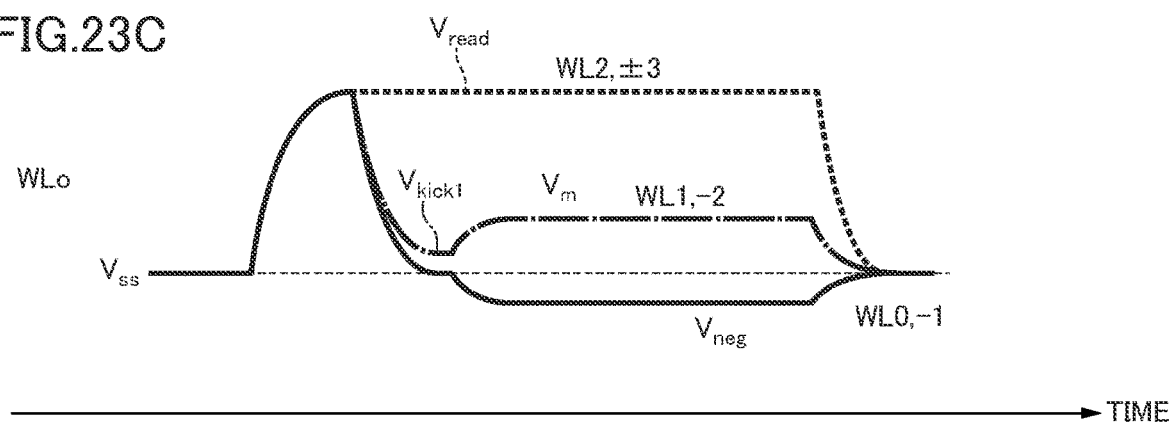

FIG. 22 is a diagram schematically showing an equivalent circuit of a memory pillar (two NAND strings adjacent to each other) and a voltage applied to each memory cell transistor through a word line in a semiconductor memory device of the present embodiment. FIGS. 23A to 23C are diagrams schematically showing the timing charts of various signals at the time of data read operation in the semiconductor memory device of the present embodiment.

The time change of the voltage applied to the word line WLo2 of the present embodiment is the same as the time change of the voltage applied to the word line WLo3 and the word line WLo5 of the first embodiment. In addition, the time change of the voltage applied to the word line WLo3 and the word line WLo4 of the present embodiment is the same as the time change of the voltage applied to the word line WLo4 of the first embodiment. In other words, in the semiconductor memory device of the present embodiment, the memory cell transistors MT to which the voltage Vneg is applied are the memory cell transistor MT6 and the memory cell transistor MT8. By increasing the number of memory cell transistors MT to which the voltage Vneg is applied, it is possible to perform a satisfactory read operation.

According to the semiconductor memory device of the present embodiment, it is possible to provide a semiconductor memory device in which a read operation is speeded up.

Third Embodiment

Figure 24:
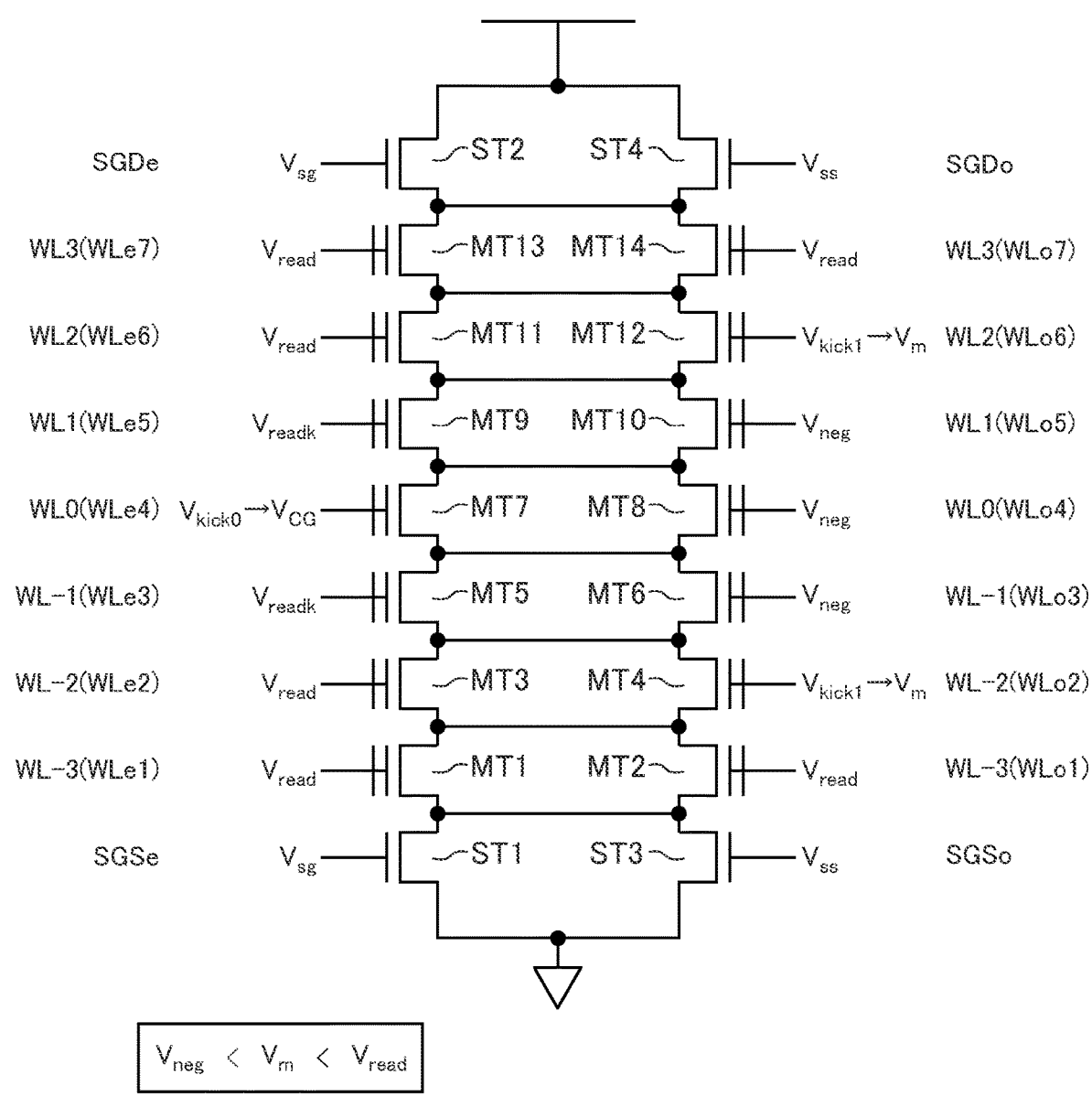
FIG. 24 is a diagram schematically showing an equivalent circuit of a memory pillar (two NAND strings adjacent to each other) and a voltage applied to each memory cell transistor through a word line in a semiconductor memory device of a third embodiment.
Figure 25A:
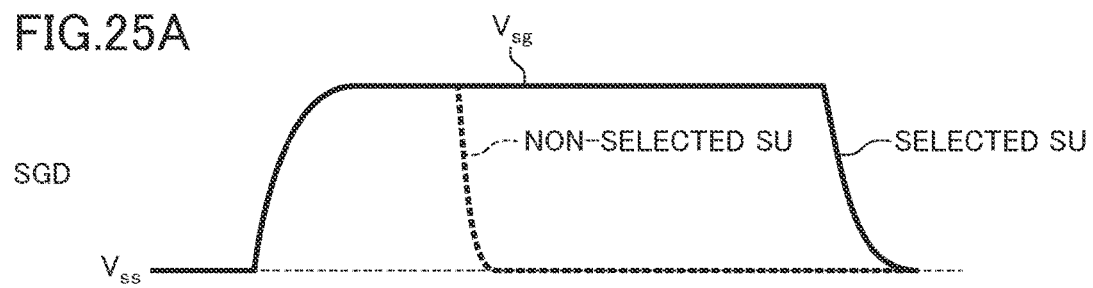
FIGS. 25A to 25C are diagrams schematically showing the timing charts of various signals at the time of data read operation in the semiconductor memory device of the third embodiment.
Figure 25B:
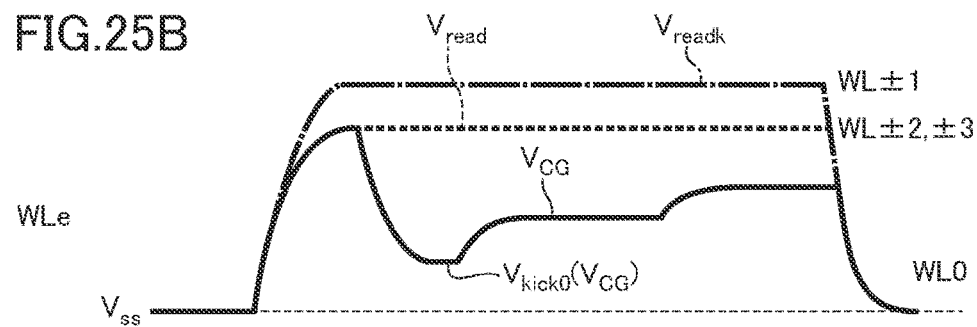
Figure 25C:
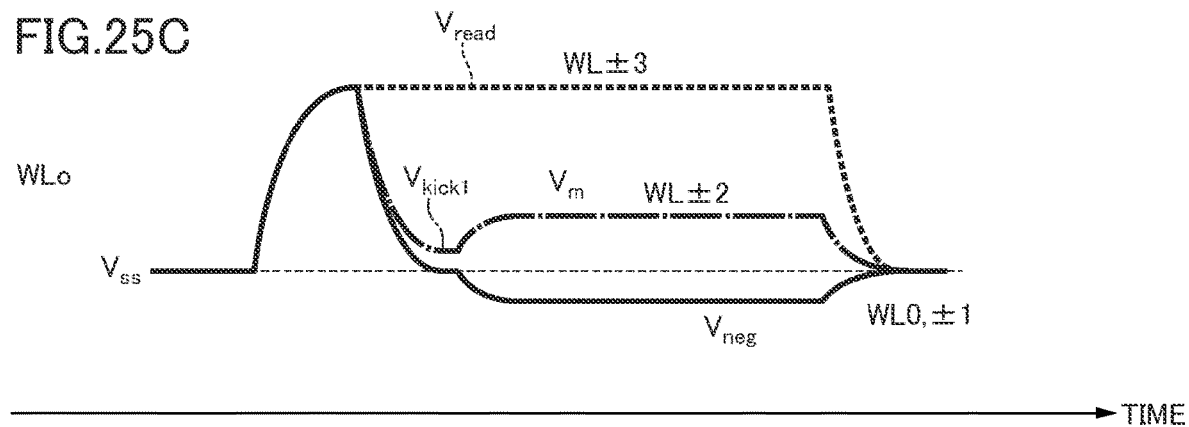

FIG. 24 is a diagram schematically showing an equivalent circuit of a memory pillar (two NAND strings adjacent to each other) and a voltage applied to each memory cell transistor through a word line in a semiconductor memory device of the present embodiment. FIGS. 25A to 25C are diagrams schematically showing the timing charts of various signals at the time of data read operation in the semiconductor memory device of the present embodiment.

The time change of the voltage applied to the word line WLo2 and the word line WLo6 of the present embodiment is the same as the time change of the voltage applied to the word line WLo3 and the word line WLo5 of the first embodiment. In addition, the time change of the voltage applied to the word line WLo3, the word line WLo4, and the word line WLo5 of the present embodiment is the same as the time change of the voltage applied to the word line WLo4 of the first embodiment. In other words, in the semiconductor memory device of the present embodiment, the memory cell transistors MT to which the voltage Vneg is applied are the memory cell transistor MT6, the memory cell transistor MT8, and the memory cell transistor MT10. By increasing the number of memory cell transistors MT to which the voltage Vneg is applied, it is possible to perform a satisfactory read operation.

According to the semiconductor memory device of the present embodiment, it is possible to provide a semiconductor memory device in which a read operation is speeded up.

Fourth Embodiment

Figure 26:
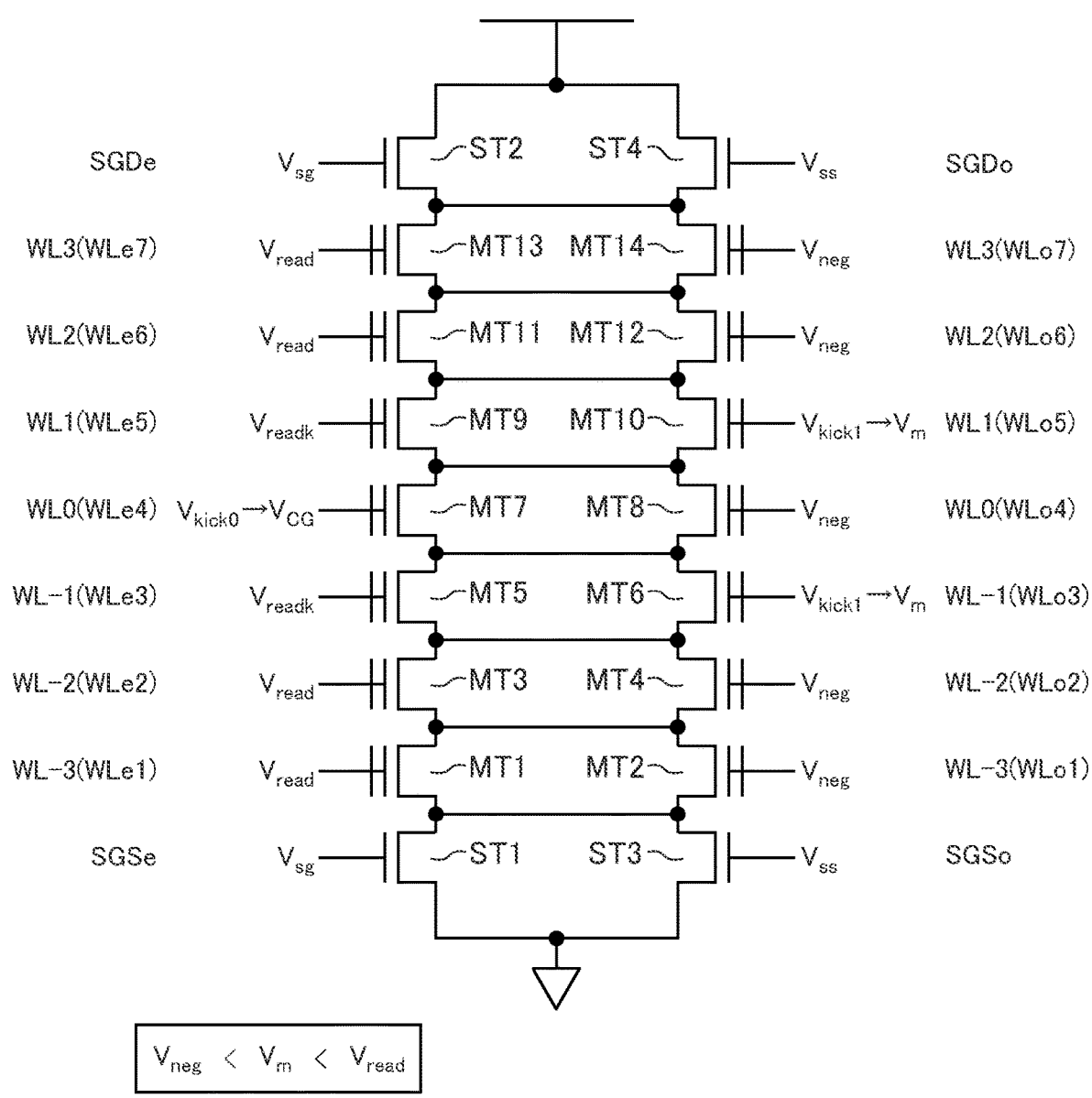
FIG. 26 is a diagram schematically showing an equivalent circuit of a memory pillar (two NAND strings adjacent to each other) and a voltage applied to each memory cell transistor through a word line in a semiconductor memory device of a fourth embodiment.
Figure 27A:
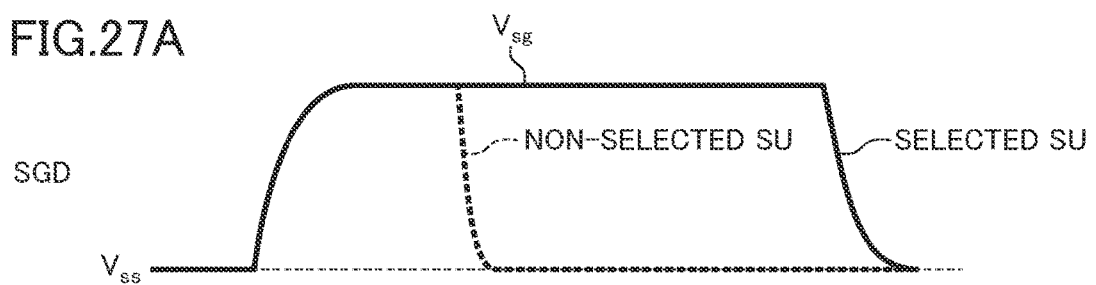
FIGS. 27A to 27C are diagrams schematically showing the timing charts of various signals at the time of data read operation in the semiconductor memory device of the fourth embodiment.
Figure 27B:
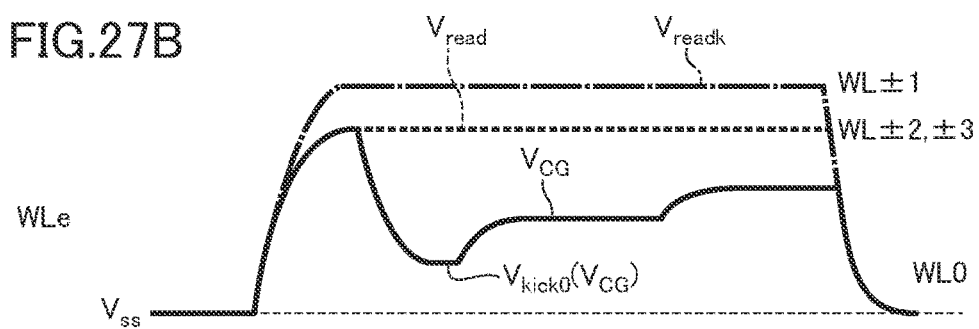
Figure 27C:
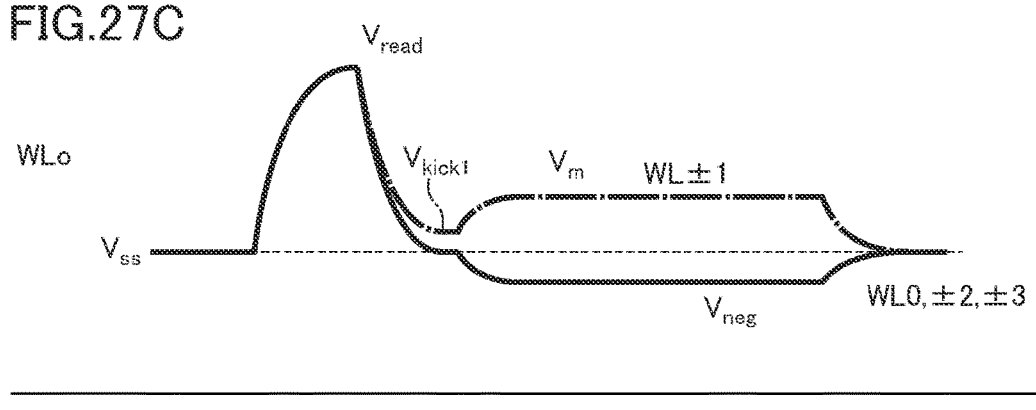

FIG. 26 is a diagram schematically showing an equivalent circuit of a memory pillar (two NAND strings adjacent to each other) and a voltage applied to each memory cell transistor through a word line in a semiconductor memory device of the present embodiment. FIGS. 27A to 27C are diagrams schematically showing the timing charts of various signals at the time of data read operation in the semiconductor memory device of the present embodiment.

In the present embodiment, the time change of the voltage applied to the word line WLo1, the word line WLo2, the word line WLo6, and the word line WLo7 is the same as the time change of the voltage applied to the word line WLo4 of the first embodiment. In other words, in the semiconductor memory device of the present embodiment, the memory cell transistors MT to which the voltage Vneg is applied are the memory cell transistor MT2, the memory cell transistor MT4, the memory cell transistor MT8, the memory cell transistor MT12, and the memory cell transistor MT14. By increasing the number of memory cell transistors MT to which the voltage Vneg is applied, it is possible to perform a satisfactory read operation.

According to the semiconductor memory device of the present embodiment, it is possible to provide a semiconductor memory device in which a read operation is speeded up.

Fifth Embodiment

Figure 28:
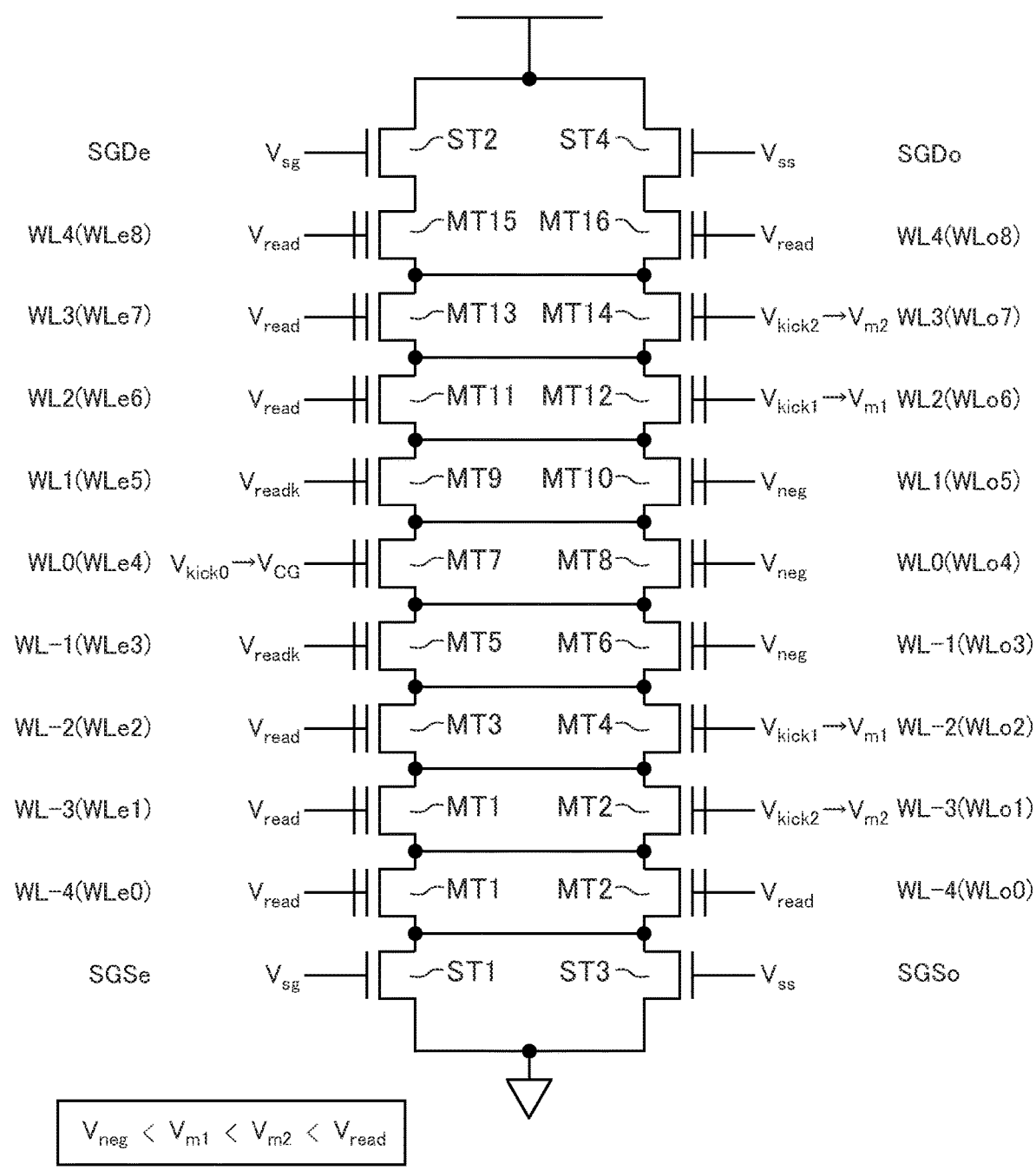
FIG. 28 is a diagram schematically showing an equivalent circuit of a memory pillar (two NAND strings adjacent to each other) and a voltage applied to each memory cell transistor through a word line in a semiconductor memory device of a fifth embodiment.
Figure 29A:
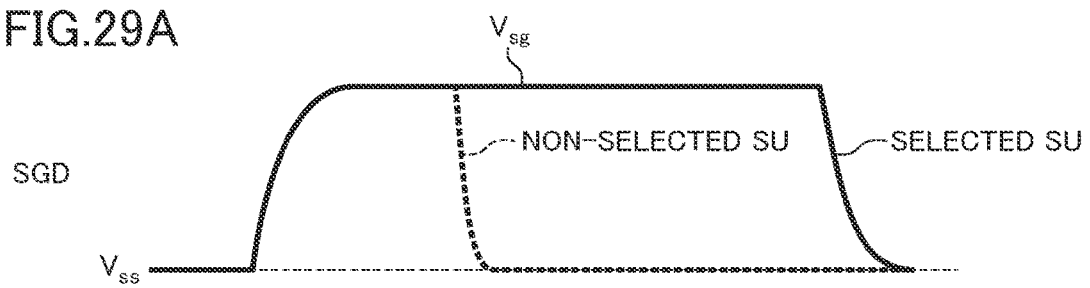
FIGS. 29A to 29C are diagrams schematically showing the timing charts of various signals at the time of data read operation in the semiconductor memory device of the fifth embodiment.
Figure 29B:
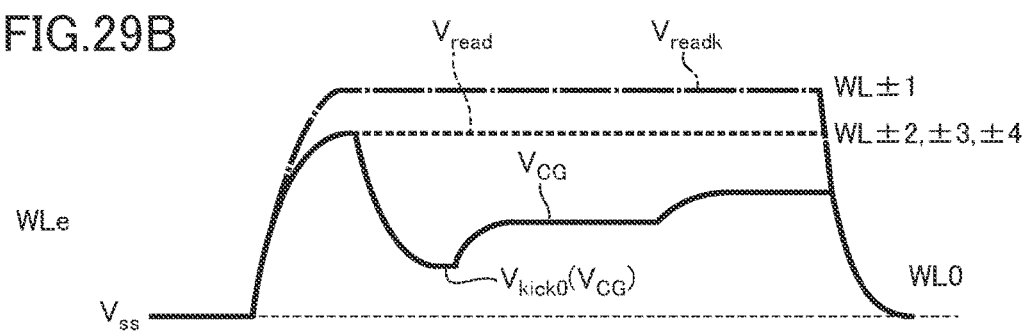
Figure 29C:
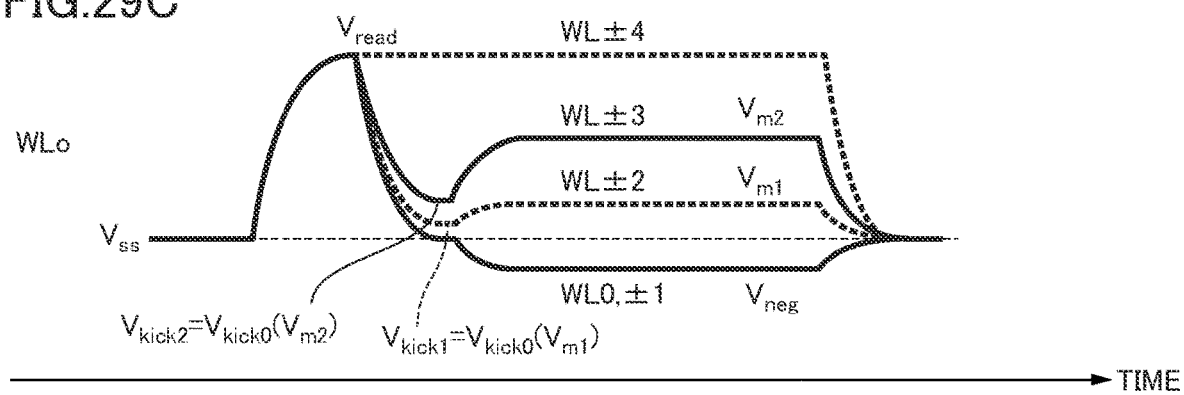

FIG. 28 is a diagram schematically showing an equivalent circuit of a memory pillar (two NAND strings adjacent to each other) and a voltage applied to each memory cell transistor through a word line in a semiconductor memory device of the present embodiment. FIGS. 29A to 29C are diagrams schematically showing the timing charts of various signals at the time of data read operation in the semiconductor memory device of the present embodiment.

In the present embodiment, the word line WLe0 is provided below the word line WLe1. The control gate of the memory cell transistor MT1 connected to the selection transistor ST1 is connected to the word line WLe0. The word line WLe8 is provided above the word line WLe7. The control gate of the memory cell transistor MT15 connected to the memory cell transistor MT13 is connected to the word line WLe8. The word line WLo0 is provided below the word line WLo1. The control gate of the memory cell transistor MT2 connected to the selection transistor ST3 is connected to the word line WLo0. The word line WLo8 is provided above the word line WLo7. The control gate of the memory cell transistor MT16 connected to the memory cell transistor MT14 is connected to the word line WLo8.

The time change of the voltage applied to the word line WLe0, the word line WLe1, the word line WLe2, the word line WLe6, the word line WLe7, the word line WLe8, the word line WLo0, and the word line WLo8 is the same as the time change of the voltage applied to the word line WLe1, the word line WLe2, the word line WLe6, the word line WLe7, the word line WLo1, the word line WLo2, the word line WLo6, and the word line WLo7 of the first embodiment.

The time change of the voltage applied to the word line WLo3, the word line WLo4, and the word line WLo5 is the same as the time change of the voltage applied to the word line WLo4 of the first embodiment.

The time change of the voltage applied to the word line WLo1, the word line WLo2, the word line WLo6, and the word line WLo7 is similar to the time change of the voltage applied to the word line WLo3 and the word line WLo5 of the first embodiment. However, in the word line WLo2 and the word line WLo6, the voltage Vkick1 lower than the voltage Vread is applied in the second operation, and the voltage Vm1 higher than the voltage Vkick1 and lower than the voltage Vread is applied in the third operation. In the word line WLo1 and the word line WLo7, the voltage Vkick2 (an example of the ninth voltage) lower than the voltage Vread is applied in the second operation, and the voltage Vm2 (an example of the tenth voltage) higher than the voltage Vkick2 and lower than the voltage Vread is applied in the third operation. Here, for example, Vkick2>Vkick1 and Vm2>Vm1. By setting the voltages Vkick1, Vkick2, Vm1, and Vm2 more finely, the read operation can be performed at a higher speed. In addition, the voltage Vm1 may be lower than the voltage Vkick1, for example. In other words, Vm1<Vkick1<Vread may be satisfied. In addition, the voltage Vm2 may be lower than the voltage Vkick2, for example. In other words, Vm2<Vkick2<Vread may be satisfied.

According to the semiconductor memory device of the present embodiment, it is possible to provide a semiconductor memory device in which a read operation is speeded up.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a substrate;
   a memory pillar extending in a first direction from the substrate;
   a first conductive layer provided above the substrate, the first conductive layer being provided separately from the substrate in the first direction, the first conductive layer being provided in parallel with a substrate surface of the substrate, and the first conductive layer facing the memory pillar;
   a second conductive layer provided above the substrate, the second conductive layer being provided to be adjacent to the first conductive layer with the memory pillar interposed between the first conductive layer and the second conductive layer in a second direction crossing the first direction, the second conductive layer being provided in parallel with the substrate surface, and the second conductive layer facing the memory pillar;
   a third conductive layer provided between the substrate and the first conductive layer, the third conductive layer being provided in parallel with the substrate surface, and the third conductive layer facing the memory pillar;
   a fourth conductive layer provided between the substrate and the second conductive layer, the fourth conductive layer being provided to be adjacent to the third conductive layer with the memory pillar interposed between the third conductive layer and the fourth conductive layer in the second direction, the fourth conductive layer being provided in parallel with the substrate surface, and the fourth conductive layer facing the memory pillar;
   a fifth conductive layer provided above the first conductive layer, the fifth conductive layer being provided in parallel with the substrate surface, and the fifth conductive layer facing the memory pillar;
   a sixth conductive layer provided above the second conductive layer, the sixth conductive layer being provided to be adjacent to the fifth conductive layer with the memory pillar interposed between the fifth conductive layer and the sixth conductive layer in the second direction, the sixth conductive layer being provided in parallel with the substrate surface, and the sixth conductive layer facing the memory pillar;
   a first memory cell formed between the first conductive layer and the memory pillar;
   a second memory cell formed between the second conductive layer and the memory pillar;
   a third memory cell formed between the third conductive layer and the memory pillar;
   a fourth memory cell formed between the fourth conductive layer and the memory pillar;
   a fifth memory cell formed between the fifth conductive layer and the memory pillar;
   a sixth memory cell formed between the sixth conductive layer and the memory pillar; and
   a control circuit, when reading data from the first memory cell, the control circuit applying a first voltage to the first conductive layer, the second conductive layer, and the sixth conductive layer and applying a second voltage higher than the first voltage to the third conductive layer and the fifth conductive layer, then applying a third voltage lower than the first voltage to the first conductive layer, applying a fourth voltage lower than the first voltage to the sixth conductive layer, and applying a fifth voltage lower than the first voltage to the second conductive layer, and then applying a sixth voltage higher than the third voltage and lower than the first voltage to the first conductive layer, applying a seventh voltage different from the fourth voltage and lower than the first voltage to the sixth conductive layer, and applying an eighth voltage lower than the fifth voltage to the second conductive layer.

2. The semiconductor memory device according to claim 1,
wherein the control circuit applies the first voltage to the fourth conductive layer when applying the first voltage to the first conductive layer, the second conductive layer, and the sixth conductive layer and applying the second voltage higher than the first voltage to the third conductive layer and the fifth conductive layer, the control circuit applies the fourth voltage to the fourth conductive layer when applying the third voltage lower than the first voltage to the first conductive layer, applying the fourth voltage lower than the first voltage to the sixth conductive layer, and applying the fifth voltage lower than the first voltage to the second conductive layer, and the control circuit applies the seventh voltage to the fourth conductive layer when applying the sixth voltage higher than the third voltage and lower than the first voltage to the first conductive layer, applying the seventh voltage different from the fourth voltage and lower than the first voltage to the sixth conductive layer, and applying the eighth voltage lower than the fifth voltage to the second conductive layer.

3. The semiconductor memory device according to claim 1, further comprising:
a seventh conductive layer provided between the substrate and the fourth conductive layer, the seventh conductive layer being provided in parallel with the substrate surface, and the seventh conductive layer facing the memory pillar; and
a seventh memory cell formed between the seventh conductive layer and the memory pillar,
wherein the control circuit applies the first voltage to the fourth conductive layer and applies the first voltage to the seventh conductive layer when applying the first voltage to the first conductive layer, the second conductive layer, and the sixth conductive layer and applying the second voltage higher than the first voltage to the third conductive layer and the fifth conductive layer, the control circuit applies the fifth voltage to the fourth conductive layer and applies the fourth voltage to the seventh conductive layer when applying the third voltage lower than the first voltage to the first conductive layer, applying the fourth voltage lower than the first voltage to the sixth conductive layer, and applying the fifth voltage lower than the first voltage to the second conductive layer, and the control circuit applies the eighth voltage to the fourth conductive layer and applies the seventh voltage to the seventh conductive layer when applying the sixth voltage higher than the third voltage and lower than the first voltage to the first conductive layer, applying the seventh voltage different from the fourth voltage and lower than the first voltage to the sixth conductive layer, and applying the eighth voltage lower than the fifth voltage to the second conductive layer.

4. The semiconductor memory device according to claim 2, further comprising:
a seventh conductive layer provided between the substrate and the third conductive layer, the seventh conductive layer being provided in parallel with the substrate surface, and the seventh conductive layer facing the memory pillar;
an eighth conductive layer provided between the substrate and the fourth conductive layer, the eighth conductive layer being provided to be adjacent to the seventh conductive layer with the memory pillar interposed between the seventh conductive layer and the eighth conductive layer in the second direction, the eighth conductive layer being provided in parallel with the substrate surface, and the eighth conductive layer facing the memory pillar;
a ninth conductive layer provided above the fifth conductive layer, the ninth conductive layer being provided in parallel with the substrate surface and the ninth conductive layer facing the memory pillar;
a tenth conductive layer provided above the sixth conductive layer, the tenth conductive layer being provided to be adjacent to the ninth conductive layer with the memory pillar interposed between the ninth conductive layer and the tenth conductive layer in the second direction, the tenth conductive layer being provided in parallel with the substrate surface, and the tenth conductive layer facing the memory pillar;
a seventh memory cell formed between the seventh conductive layer and the memory pillar;
an eighth memory cell formed between the eighth conductive layer and the memory pillar;
a ninth memory cell formed between the ninth conductive layer and the memory pillar; and
a tenth memory cell formed between the tenth conductive layer and the memory pillar,
wherein the control circuit applies the first voltage to the seventh conductive layer, the eighth conductive layer, the ninth conductive layer, and the tenth conductive layer when applying the first voltage to the first conductive layer, the second conductive layer, and the sixth conductive layer, applying the second voltage higher than the first voltage to the third conductive layer and the fifth conductive layer, and applying the first voltage to the fourth conductive layer, the control circuit applies the fifth voltage to the eighth conductive layer and the tenth conductive layer when applying the third voltage lower than the first voltage to the first conductive layer, applying the fourth voltage lower than the first voltage to the sixth conductive layer, applying the fifth voltage lower than the first voltage to the second conductive layer, and applying the fourth voltage to the fourth conductive layer, and the control circuit applies the eighth voltage to the eighth conductive layer and the tenth conductive layer when applying the sixth voltage higher than the third voltage and lower than the first voltage to the first conductive layer, applying the seventh voltage higher than the fourth voltage and lower than the first voltage to the sixth conductive layer, applying the eighth voltage lower than the fifth voltage to the second conductive layer, and applying the seventh voltage to the fourth conductive layer.

5. The semiconductor memory device according to claim 1,
wherein the seventh voltage is higher than the fourth voltage.

6. The semiconductor memory device according to claim 1,
wherein the third voltage and the fourth voltage are applied at the same time.

7. The semiconductor memory device according to claim 1,
wherein the control circuit includes:
a sequencer;
a first regulator circuit connected to the sequencer, and the first regulator circuit being configured to apply the first voltage to the first conductive layer;
a second regulator circuit connected to the sequencer, and the second regulator circuit being configured to apply the second voltage to the third conductive layer and the fifth conductive layer;
a third regulator circuit connected to the sequencer, and the third regulator circuit being configured to apply the sixth voltage to the first conductive layer; and
a fourth regulator circuit connected to the sequencer, and the fourth regulator circuit being configured to apply the seventh voltage to the fourth conductive layer and the sixth conductive layer.

8. The semiconductor memory device according to claim 1,
wherein the first memory cell includes a first charge storage film,
the second memory cell includes a second charge storage film, and
the first charge storage film and the second charge storage film are connected to each other by a film containing a material contained in the first charge storage film and the second charge storage film.

9. The semiconductor memory device according to claim 1,
wherein the fifth voltage is lower than the third voltage and the fourth voltage.

10. A semiconductor memory device, comprising:
a substrate;
a memory pillar extending in a first direction from the substrate;
a first conductive layer provided above the substrate, the first conductive layer being provided separately from the substrate in the first direction, the first conductive layer being provided in parallel with a substrate surface of the substrate, and the first conductive layer facing the memory pillar;
a second conductive layer provided above the substrate, the second conductive layer being provided to be adjacent to the first conductive layer with the memory pillar interposed between the first conductive layer and the second conductive layer in a second direction crossing the first direction, the second conductive layer being provided in parallel with the substrate surface, and the second conductive layer facing the memory pillar;
a third conductive layer provided between the substrate and the first conductive layer, the third conductive layer being provided in parallel with the substrate surface, and the third conductive layer facing the memory pillar;
a fourth conductive layer provided between the substrate and the second conductive layer, the fourth conductive layer being provided to be adjacent to the third conductive layer with the memory pillar interposed between the third conductive layer and the fourth conductive layer in the second direction, the fourth conductive layer being provided in parallel with the substrate surface, and the fourth conductive layer facing the memory pillar;
a fifth conductive layer provided above the first conductive layer, the fifth conductive layer being in parallel with the substrate surface, and the fifth conductive layer facing the memory pillar;
a sixth conductive layer provided above the second conductive layer, the sixth conductive layer being provided to be adjacent to the fifth conductive layer with the memory pillar interposed between the fifth conductive layer and the sixth conductive layer in the second direction, the sixth conductive layer being provided in parallel with the substrate surface, and the sixth conductive layer facing the memory pillar;
a seventh conductive layer provided between the substrate and the third conductive layer, the seventh conductive layer being provided in parallel with the substrate surface, and the seventh conductive layer facing the memory pillar;
an eighth conductive layer provided between the substrate and the fourth conductive layer, the eighth conductive layer being provided to be adjacent to the seventh conductive layer with the memory pillar interposed between the seventh conductive layer and the eighth conductive layer in the second direction, the eighth conductive layer being provided in parallel with the substrate surface, and the eighth conductive layer facing the memory pillar;
a ninth conductive layer provided above the fifth conductive layer, the ninth conductive layer being provided in parallel with the substrate surface, and the ninth conductive layer facing the memory pillar;
a tenth conductive layer provided above the sixth conductive layer, the tenth conductive layer being provided to be adjacent to the ninth conductive layer with the memory pillar interposed between the ninth conductive layer and the tenth conductive layer in the second direction, the tenth conductive layer being provided in parallel with the substrate surface, and the tenth conductive layer facing the memory pillar;
a first memory cell formed between the first conductive layer and the memory pillar;
a second memory cell formed between the second conductive layer and the memory pillar;
a third memory cell formed between the third conductive layer and the memory pillar;
a fourth memory cell formed between the fourth conductive layer and the memory pillar;
a fifth memory cell formed between the fifth conductive layer and the memory pillar;
a sixth memory cell formed between the sixth conductive layer and the memory pillar;
a seventh memory cell formed between the seventh conductive layer and the memory pillar;
an eighth memory cell formed between the eighth conductive layer and the memory pillar;
a ninth memory cell formed between the ninth conductive layer and the memory pillar;
a tenth memory cell formed between the tenth conductive layer and the memory pillar; and
a control circuit, when reading data from the first memory cell, the control circuit applying a first voltage to the first conductive layer, the second conductive layer, the fourth conductive layer, the sixth conductive layer, the seventh conductive layer, the eighth conductive layer, the ninth conductive layer, and the tenth conductive layer and applying a second voltage higher than the first voltage to the third conductive layer and the fifth conductive layer, then applying a third voltage lower than the first voltage to the first conductive layer, applying a fourth voltage lower than the first voltage to the eighth conductive layer and the tenth conductive layer, and applying a fifth voltage lower than the first voltage to the second conductive layer, the fourth conductive layer, and the sixth conductive layer, and then applying a sixth voltage higher than the third voltage and lower than the first voltage to the first conductive layer, applying a seventh voltage different from the fourth voltage and lower than the first voltage to the eighth conductive layer and the tenth conductive layer, and applying an eighth voltage lower than the fifth voltage to the second conductive layer, the fourth conductive layer, and the sixth conductive layer.

11. The semiconductor memory device according to claim 10,
wherein the seventh voltage is higher than the fourth voltage.

12. The semiconductor memory device according to claim 10, further comprising:
an eleventh conductive layer provided between the substrate and the seventh conductive layer, the eleventh conductive layer being provided in parallel with the substrate surface, and the eleventh conductive layer facing the memory pillar;
a twelfth conductive layer provided between the substrate and the eighth conductive layer, the twelfth conductive layer being provided to be adjacent to the eleventh conductive layer with the memory pillar interposed between the eleventh conductive layer and the twelfth conductive layer in the second direction, the twelfth conductive layer being provided in parallel with the substrate surface, and the twelfth conductive layer facing the memory pillar;
a thirteenth conductive layer provided above the ninth conductive layer, the thirteenth conductive layer being provided in parallel with the substrate surface and the thirteenth conductive layer facing the memory pillar;
a fourteenth conductive layer provided above the tenth conductive layer, the fourteenth conductive layer being provided to be adjacent to the thirteenth conductive layer with the memory pillar interposed between the thirteenth conductive layer and the fourteenth conductive layer in the second direction, the fourteenth conductive layer being provided in parallel with the substrate surface, and the fourteenth conductive layer facing the memory pillar;
an eleventh memory cell formed between the eleventh conductive layer and the memory pillar;
a twelfth memory cell formed between the twelfth conductive layer and the memory pillar;
a thirteenth memory cell formed between the thirteenth conductive layer and the memory pillar; and
a fourteenth memory cell formed between the fourteenth conductive layer and the memory pillar,
wherein the control circuit applies the first voltage to the eleventh conductive layer, the twelfth conductive layer, the thirteenth conductive layer, and the fourteenth conductive layer when applying the first voltage to the first conductive layer, the second conductive layer, the fourth conductive layer, the sixth conductive layer, the seventh conductive layer, the eighth conductive layer, the ninth conductive layer, and the tenth conductive layer and applying the second voltage to the third conductive layer and the fifth conductive layer, the control circuit applies a ninth voltage higher than the fourth voltage and lower than the first voltage to the twelfth conductive layer and the fourteenth conductive layer when applying the third voltage to the first conductive layer, applying the fourth voltage to the eighth conductive layer and the tenth conductive layer, and applying the fifth voltage to the second conductive layer, the fourth conductive layer, and the sixth conductive layer, and the control circuit applies a tenth voltage different from the ninth voltage and lower than the first voltage to the twelfth conductive layer and the fourteenth conductive layer when applying the sixth voltage higher than the third voltage and lower than the first voltage to the first conductive layer, applying the seventh voltage to the eighth conductive layer and the tenth conductive layer, and applying the eighth voltage to the second conductive layer, the fourth conductive layer, and the sixth conductive layer.

13. The semiconductor memory device according to claim 12,
wherein the tenth voltage is higher than the ninth voltage.

14. The semiconductor memory device according to claim 12,
wherein the third voltage, the fourth voltage, and the ninth voltage are applied at the same time.

15. The semiconductor memory device according to claim 10,
wherein the fifth voltage is lower than the third voltage and the fourth voltage.

16. The semiconductor memory device according to claim 10,
wherein the control circuit includes:
a sequencer;
a first regulator circuit connected to the sequencer, and the first regulator circuit being configured to apply the first voltage to the first conductive layer;
a second regulator circuit connected to the sequencer, and the second regulator circuit being configured to apply the second voltage to the third conductive layer and the fifth conductive layer;
a third regulator circuit connected to the sequencer, and the third regulator circuit being configured to apply the sixth voltage to the first conductive layer; and
a fourth regulator circuit connected to the sequencer, and the fourth regulator circuit being configured to apply the seventh voltage to the fourth conductive layer and the sixth conductive layer.

17. The semiconductor memory device according to claim 10,
wherein the first memory cell includes a first charge storage film,
the second memory cell includes a second charge storage film, and
the first charge storage film and the second charge storage film are connected to each other by a film containing a material contained in the first charge storage film and the second charge storage film.

* * * * *